United States Patent [19]
Hirota

[11] Patent Number: 6,104,072
[45] Date of Patent: *Aug. 15, 2000

[54] ANALOGUE MISFET WITH THRESHOLD VOLTAGE ADJUSTER

[75] Inventor: Isao Hirota, Kanagawa, Japan

[73] Assignee: Sony Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/502,257

[22] Filed: Jul. 13, 1995

[30] Foreign Application Priority Data

Jul. 15, 1994 [JP] Japan .................................. 6-164310

[51] Int. Cl.[7] .................................................. H01L 29/76
[52] U.S. Cl. ........................... 257/405; 257/215; 257/368
[58] Field of Search ..................................... 257/405, 406, 257/72, 368, 379, 239, 215, 225, 235

[56] References Cited

U.S. PATENT DOCUMENTS

| | | | |
|---|---|---|---|
| 3,591,852 | 7/1971 | Chen ........................................ | 257/406 |
| 4,057,788 | 11/1977 | Sage ........................................ | 257/411 |
| 4,232,221 | 11/1980 | Millea et al. ........................... | 257/405 |
| 5,199,053 | 3/1993 | Hirama .................................... | 257/239 |
| 5,238,863 | 8/1993 | Fukusho et al. ........................ | 438/144 |
| 5,321,289 | 6/1994 | Baba et al. .............................. | 257/331 |
| 5,436,481 | 7/1995 | Egawa et al. ........................... | 257/324 |
| 5,617,351 | 4/1997 | Bertin et al. ............................ | 257/320 |

FOREIGN PATENT DOCUMENTS

| | | |
|---|---|---|
| 0 213 972 A1 | 5/1986 | European Pat. Off. . |
| 0 621 603 A1 | 4/1993 | European Pat. Off. . |
| 0 605 958 A1 | 7/1994 | European Pat. Off. . |
| 0 621 603 A1 | 10/1994 | European Pat. Off. . |
| 2 204 203 | 11/1988 | United Kingdom . |
| WO 82/04162 | 11/1982 | WIPO . |

OTHER PUBLICATIONS

IBM Technical Disclosure Bulletin, vol. 14, No. 8, p. 2476 by Kumyz et al., Jan. 1972.
IBM Technical Disclosure Bulletin, "Alteration of Threshold Voltage of Enhancement Field–Effect Transistors", vol. 29, No. 7, p. 3202, Dec. 1, 1986.
Patent Abstracts of Japan, vol. 16, No. 8, Mitsubishi Electric Corp., (E–1152), Jan. 10, 1992 & JP 03 230566A, Oct. 14, 1991.
Patent Abstracts of Japan, vol. 16, No. 8, Jan. 10, 1992; JP–A–03 230566.
Patent Abstracts of Japan, vol. 9, No. 321, Dec. 17, 1985, JP60–153 158 A.

*Primary Examiner*—Mark V. Prenty
*Attorney, Agent, or Firm*—Hill & Simpson

[57] ABSTRACT

A threshold voltage or a channel potential of a MIS device can be set in an analogue fashion. A MIS device includes a multi-layer structure having a gate insulating film in which an oxide film, a nitride film and an oxide film are laminated in that order. The threshold voltage or channel potential of the MIS device can be controlled by an amount of electric charges injected into the nitride film.

6 Claims, 24 Drawing Sheets

FIG.10
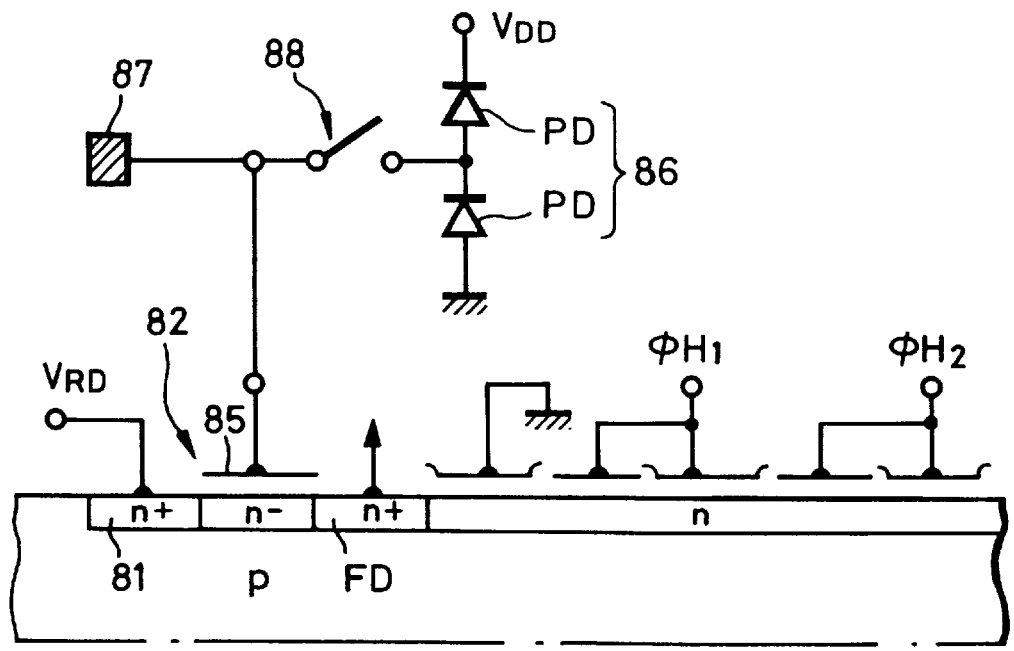
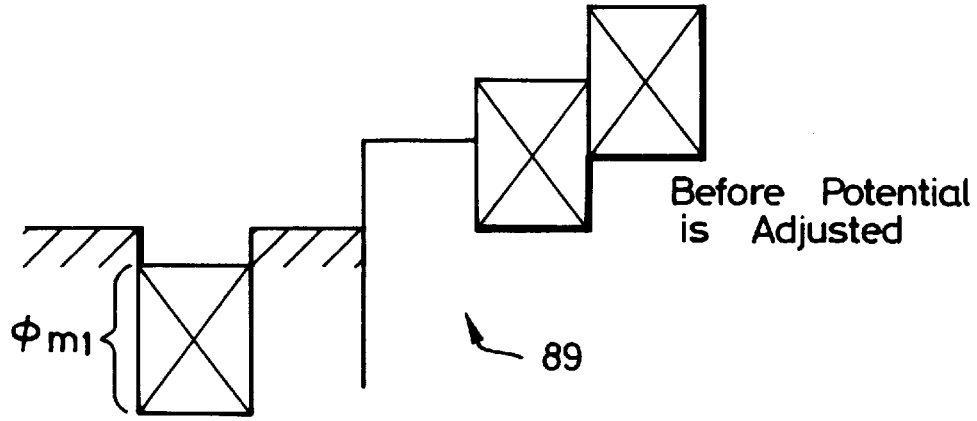
Before Potential is Adjusted
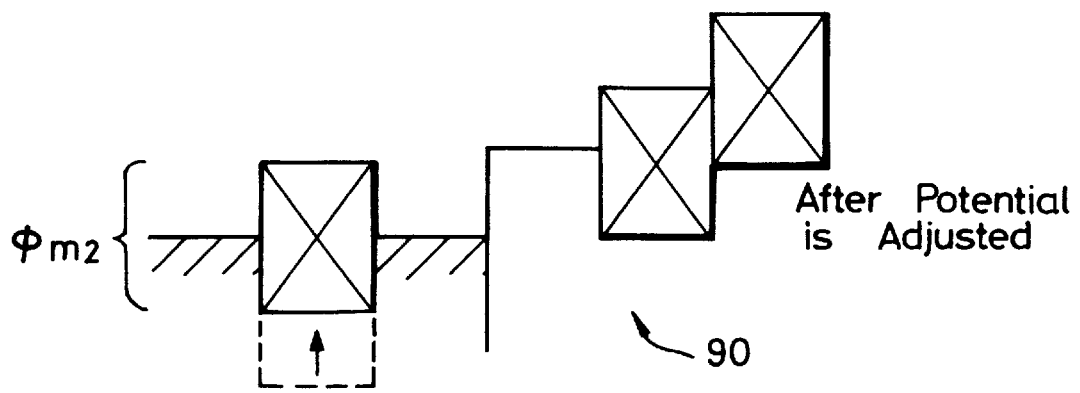
After Potential is Adjusted

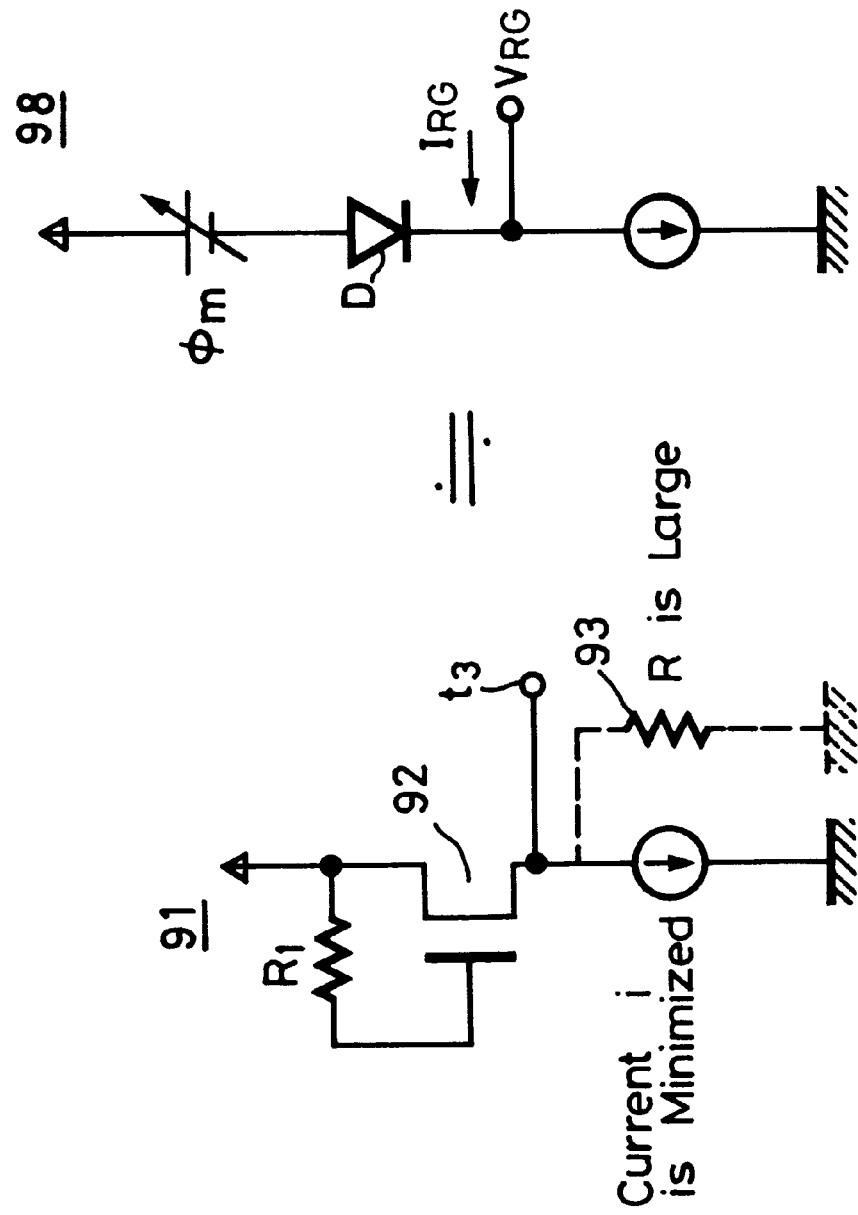

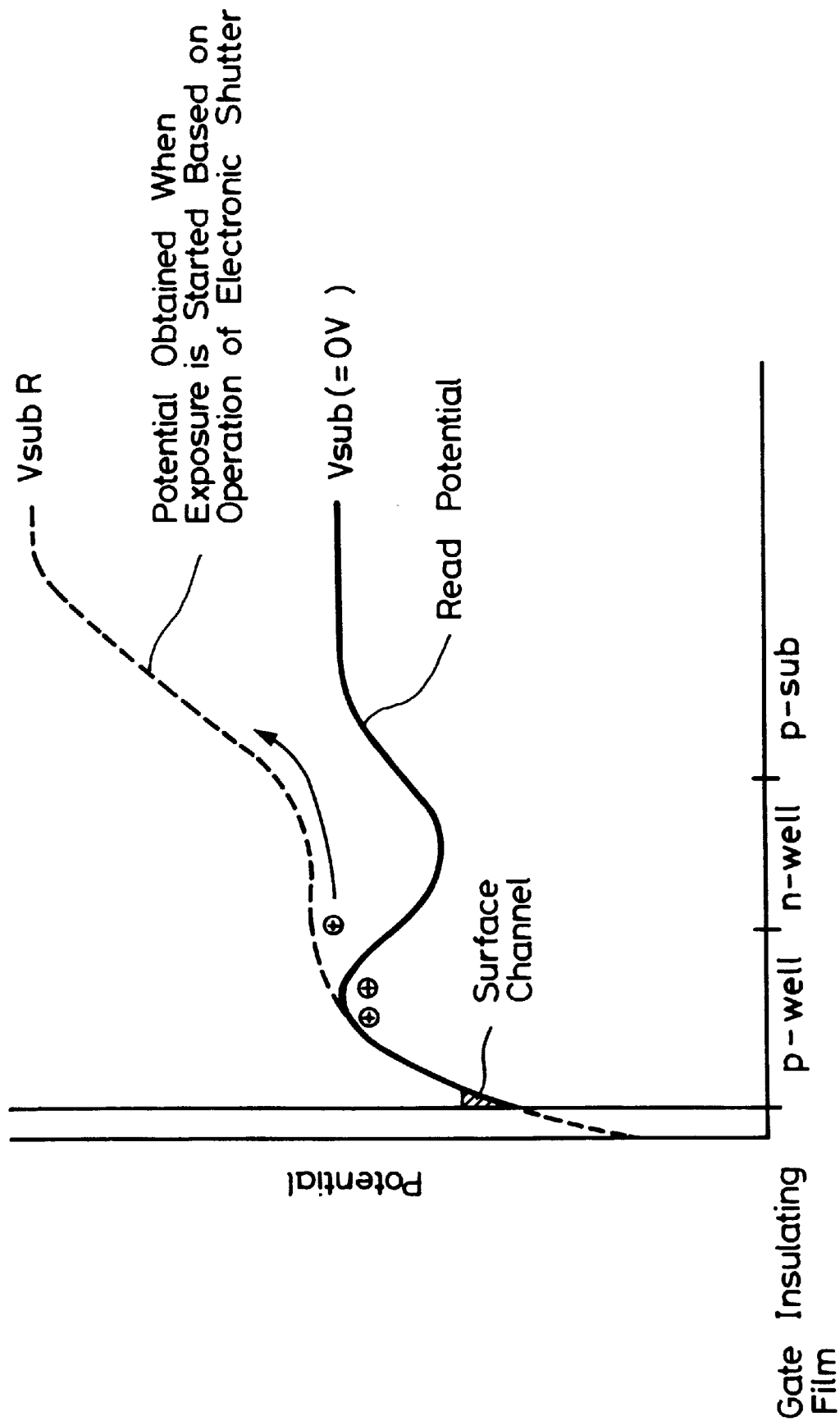

6,104,072

ANALOGUE MISFET WITH THRESHOLD VOLTAGE ADJUSTER

BACKGROUND OF THE INVENTION

The present invention relates to a MIS (metal-insulator-semiconductor) device (including MISFET (metal-insulator-semiconductor field-effect-transistor) and CCD (charge-coupled-device) structures), an analogue MISFET using MIS device, a threshold voltage correcting method using MIS device, a potential adjusting method using MIS device, a bias circuit using MIS device, a charge transfer device using MIS device, a solid-state imaging device using MIS device and a charge detecting apparatus using MIS device.

More particularly, this invention relates to a MIS device in which a threshold voltage or channel potential can be controlled in an analogue fashion.

This invention relates to a method of correcting a threshold voltage in which a fluctuation of a threshold voltage between MIS devices of a semiconductor integrated circuit composed of a plurality of MIS devices can be corrected.

This invention relates to a method of adjusting a channel potential in which a channel potential of a MIS device can be adjusted.

This invention relates to a bias circuit in which an output bias can be set in an analogue fashion.

This invention relates to a charge transfer device using a CCD.

This invention relates to a solid-state imaging device, such as a CCD solid-state imaging device and an amplifying-type solid-state imaging device.

This invention relates to a charge detecting device used in a solid-state imaging device.

CCD solid-state imaging devices have an imaging region composed of an n-type semiconductor substrate, a p-type well region formed on the n-type semiconductor substrate and a plurality of n-type photoelectric conversion portions, i.e., light-receiving portions formed on the p-type well region in a matrix fashion.

In the above CCD solid-state imaging device, an allowable amount of signal charges e accumulated in the light-receiving portion when light becomes incident on the light-receiving portion, i.e., an amount of signal charges treated by the light-receiving portion is determined by a height of a potential barrier $\phi_a$ of an overflow barrier OFB composed of the p-type well region as shown in potential distribution diagrams of FIGS. 1A and 1B. Specifically, if the signal charges e accumulated in the light-receiving portion exceeds the amount of signal charges treated by the light-receiving portion, then extra charges are overflowed through the potential barrier f, of the overflow barrier OFB and discharged to the n-type substrate forming an overflow drain OFD.

The amount of signal charges treated by the light-receiving portion, i.e., the height of the potential barrier $\phi_a$ of the overflow barrier OFB is controlled by a bias voltage applied to the n-type substrate forming the overflow drain OFD, i.e., so-called substrate voltage $V_{sub}$. However, according to this device structure, since device structures are frequently fluctuated when they are manufactured, the height of the potential barrier $\phi_a$ of the overflow barrier OFB is frequently fluctuated as shown by a dotted line height $\phi_a'$ in FIG. 1A. Therefore, each time devices are manufactured, different substrate voltages $V_{sub}$, $V_{sub}'$ have to be set, respectively.

In the CCD solid-state imaging device, as shown in FIG. 2, a floating diffusion region FD for converting electric charges into voltages is formed at the succeeding stage of a horizontal transfer register 1 through a horizontal output gate portion HOG. There are provided a reset gate portion 2 and a reset drain region 3 for resetting signal charges transferred to the floating diffusion region FD at every pixel.

The horizontal transfer register 1 is composed of an n-type transfer channel region 5 formed on the surface of the p-type well region 4, for example, a gate insulating film and a plurality of transfer electrodes 6 [6A, 6B]. The adjacent two transfer electrodes 6A and 6B are paired. Two-phase horizontal drive pulses $\phi H_1$ and $\phi H_2$ are applied to every pair of transfer electrodes 6 [6A, 6B] and every other pair of transfer electrodes 6 [6A, 6B]. A p-type region 7, for example, is formed on the transfer channel region 5 under each second transfer electrode 6B by implantation of ions thereby to form a transfer portion including a storage electrode formed of the first transfer electrode 6A and a transfer portion formed of the second transfer electrode 6B.

The horizontal output gate portion HOG is composed of the gate insulating film (not shown) and a gate electrode 8 formed thereon through the gate insulating film. A ground potential is applied to the gate electrode 8. The floating diffusion region FD is formed of an n-type semiconductor region, for example, and connected to a charge detector 9 whose detected output signal is obtained at an output terminal $t_1$. The reset drain region 3 is formed of an n-type semiconductor region, for example, and a reset voltage $V_{RD}$, e.g., a power supply voltage $V_{DD}$ is applied to the reset drain region 3.

The reset gate portion 2 is composed of the gate insulating film (not shown) and a gate electrode 10 formed thereon through the gate insulating film. A reset pulse G is applied to the gate electrode 10.

In recent CCD solid-state imaging devices, a driver circuit for applying the drive pulses $\phi H_1$, $\phi H_2$ is incorporated in the horizontal transfer register 1 and a driver circuit for applying the reset pulse $\phi_{RG}$ is incorporated in a timing generator. Moreover, in order to reduce a power consumption, an amplitude of a pulse is lowered.

Since an operation point of the reset pulse $\phi_{RG}$ is determined depending on the power supply voltage $V_{DD}$ which is the reset voltage $V_{RD}$, there is then the problem that a potential under the reset gate portion 2 is fluctuated (shown by a dotted line in FIG. 2). To solve this problem, a DC bias value of the reset pulse $\phi_{RG}$ has to be set to a desired value for every device. The DC bias value of the reset pulse $\phi_{RG}$ is set by an external circuit (i.e., so-called bias circuit). When the driver circuit for applying the reset pulse $\phi_{RG}$ is incorporated within the timing generator, the DC bias value of the reset pulse $\phi_{RG}$ is digitally set in a so-called phase-cut fashion.

Further, an amplifying type solid-state imaging device is known as a solid-state imaging device. The amplifying type solid-state imaging device accumulates photoelectrically-converted holes (signal charges) in a p-type well region of an n-channel MOS (metal-oxide-semiconductor) transistor and outputs a change of channel current based on a potential fluctuation (i.e., potential change in the back-gate) in the p-type well region as a pixel signal. An n-type well region is formed on a p-type substrate and the p-type well region in which signal charges are accumulated. This amplifying type solid-state imaging device also has to set a substrate voltage.

On the other hand, there is known an ultraviolet-light-erasure ROM (read-only memory) having a gate insulating film formed of an SiN film to memorize data by controlling a potential. FIG. 3 shows an example of such ultravioletlight-erasure ROM. As shown in FIG. 3, a p-type region 11 has an n-type source region 12 and an n-type drain region 13 formed on its surface. A gate electrode 17 made of polycrystalline silicon, for example, is formed between the n-type source region 12 and the n-type drain region 13 through a gate insulating film 16 composed of a silicon oxide film 14 and a silicon nitride film 15. Electrons or holes are accumulated in the silicon nitride film 15 to achieve a memory effect. However, this ROM can be turned on and off in a digital fashion. Therefore, when the SiN layer and the gate electrode contact with each other, injected electric charges e' tend to be leaked to the gate portion and a DC bias of this ROM cannot be controlled in an analogue fashion.

Although CCD solid-state imaging devices are products using a potential of a so-called MIS device, the potential of the MIS device is difficult to be controlled and hence manufactured products of the CCD solid-state imaging devices are not uniform in potential. The potential shift has heretofore been avoided by controlling a bias applied from the outside. The same assignee of this application has previously proposed a method in which a fluctuation of potential is measured and adjusted selectively forcibly. The aforesaid ROM is known as the MIS device whose operation point can be changed later. This ROM can be operated in a digital fashion and therefore a potential cannot be adjusted in an analogue fashion.

SUMMARY OF THE INVENTION

In view of the aforesaid aspects, it is an object of the present invention to provide a metal-insulator-semiconductor (MIS) device and a solid-state imaging device using the MIS device in which a potential need not be adjusted from the outside, a setting of a DC bias voltage used upon resetting need not be adjusted from the outside and in which a setting of a substrate voltage need not be adjusted from the outside.

It is another object of the present invention to provide a charge transfer device and a charge detecting device using the above MIS device which can be applied to a solid-state imaging device.

It is a further object of the present invention to provide a bias circuit using the above MIS device which can set a bias value of a solid-state imaging device.

It is a yet further object of the present invention to provide an analogue MISFET (metal-insulator-semiconductor field-effect-transistor) using the above MIS device which can be applied to an analogue circuit.

It is a still further object of the present invention to provide a threshold voltage correcting method using the MIS device in which fluctuations of threshold values between the MIS devices and a channel potential adjustment method using the MIS device in which a channel potential of MIS device can be adjusted.

According to a first aspect of the present invention, there is provided a metal-insulator-semiconductor (MIS) device which is comprised of a semiconductor layer, a gate electrode formed on the semiconductor layer, and a gate insulating film formed between the semiconductor layer and the gate electrode, the gate insulating film holding electric charges to adjust a threshold voltage or a channel potential.

According to a second aspect of the present invention, there is provided a method of adjusting a threshold voltage of a MIS device of a semiconductor integrated circuit composed of a plurality of MIS devices. This method comprises the step of injecting electric charges into a gate insulating film so as to correct fluctuations of threshold voltages between the MIS devices.

According to a third aspect of the present invention, there is provided a method of adjusting a channel potential of a MIS device. This method comprises the steps of comparing a channel potential of a MIS device with a reference value, and injecting electric charges for correcting a difference between the channel potential and the reference value into a gate insulating film of the MIS device.

According to a fourth aspect of the present invention, there is provided a bias circuit which is comprised of a load resistor and a MIS field effect transistor connected in series between first and second potentials, wherein the MIS field effect transistor has a gate insulating film into which electric charges for adjusting a channel potential are injected thereby to adjust a threshold voltage of the MIS field effect transistor.

According to a fifth aspect of the present invention, there is provided a method of adjusting a bias circuit having a load resistor and a MIS field effect transistor connected in series between first and second potentials. This method comprises the steps of adjusting a channel potential by injecting electric charges into a gate insulating film of a MIS field effect transistor, and setting said MIS field effect transistor in the enhancement mode after the adjustment process.

According to a sixth aspect of the present invention, there is provided a charge transfer device which is comprised of a charge transfer portion, a floating capacitor for accumulating electric charges transferred by the charge transfer portion, a reset transistor for setting a potential of the floating capacitor to a predetermined potential, and a bias circuit for generating a bias voltage supplied to a control electrode of the reset transistor, wherein the bias circuit includes a load and a MIS field effect transistor connected in series between the first and second potentials and the MIS field effect transistor has a gate insulating film into which electric charges for adjusting a channel potential are injected.

In accordance with a seventh aspect of the present invention, there is provided a solid-state imaging device which is comprised of a plurality of pixels, means for outputting signals obtained from the pixels, a discharge means for discharging unnecessary signals of the pixels, and a bias circuit for generating a control voltage to control a discharge operation of the discharge means, wherein the bias circuit includes a load resistor and a MIS field effect transistor connected in series between first and second potentials and the MIS field effect transistor has a gate insulating film into which electric charges for adjusting a channel potential are injected.

In accordance with an eighth aspect of the present invention, there is provided a charge detecting device which is comprised of a floating capacitor for accumulating signal charges, a detecting circuit for detecting signal charges accumulated in the floating capacitor, and a MIS field effect transistor for resetting a potential of the floating capacitor to a predetermined potential, the MIS field effect transistor having a gate insulating film into which electric charges of a predetermined amount are injected.

BRIEF DESCRIPTION OF THE DRAWINGS

FIG. 10 is a schematic diagram including a potential distribution diagram used to explain how to adjust a potential in a reset gate portion of the CCD solid-state imaging device;

FIG. 13 a circuit diagram of a circuit used to explain the present invention;

FIG. 14 is a circuit diagram showing an equivalent circuit obtained after a potential in the circuit shown in FIG. 13 has been adjusted;

FIG. 25 is a potential distribution diagram showing potentials obtained when the amplifying type solid-state imaging device shown in FIG. 24 is read out and reset.

DETAILED DESCRIPTION OF THE PREFERRED EMBODIMENTS

Embodiments of the present invention will hereinafter be described with reference to the drawings.

Initially, a device having a metal (electrode)insulator-semiconductor structure, i.e., so-called MIS device according to an embodiment of the present invention will be described. The MIS device according to this embodiment can set a potential or a threshold voltage $V_{th}$ under the gate in an analogue fashion by controlling an amount of signal charges, such as electrons and holes, accumulated in a gate insulating film, in particular, a nitride film in an analogue fashion.

Figure 1A:
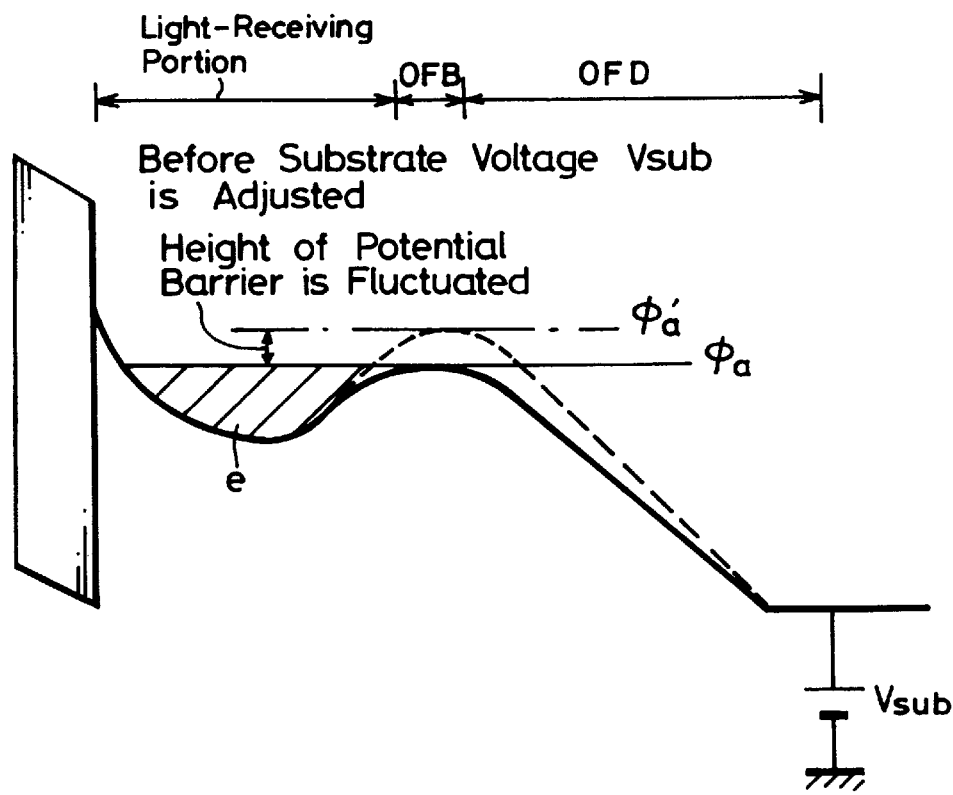
FIG. 1A is a potential diagram showing signal charges accumulated in the substrate when a light-receiving portion of a CCD solid-state imaging device receives light and showing measured results of a height of a potential barrier before a substrate voltage is adjusted.
Figure 1B:
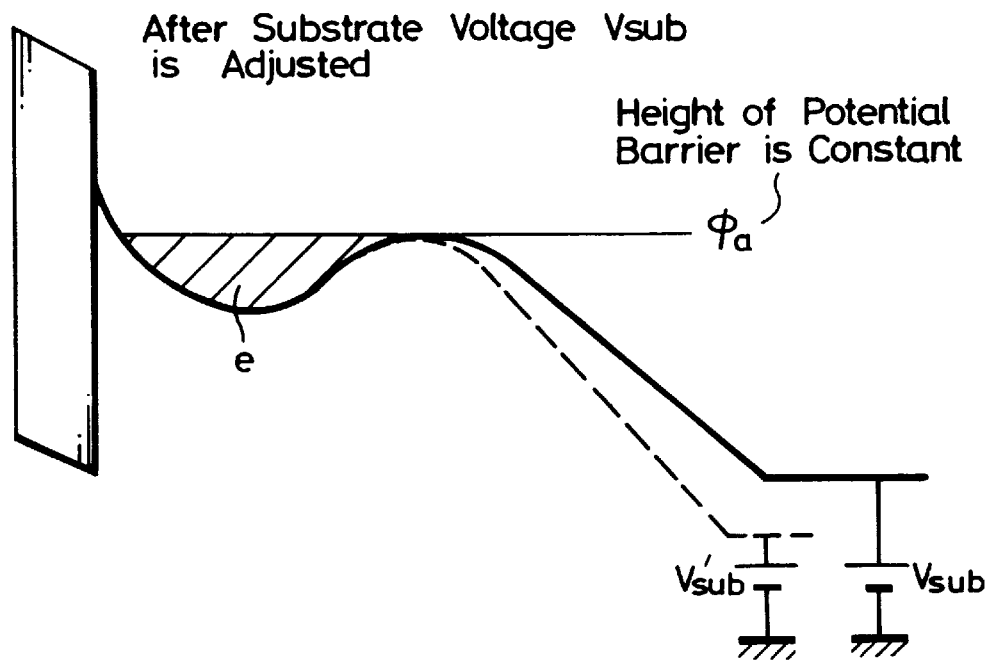
FIG. 1B is a potential diagram showing measured results of a height of a potential barrier after a substrate voltage is adjusted.
Figure 2:
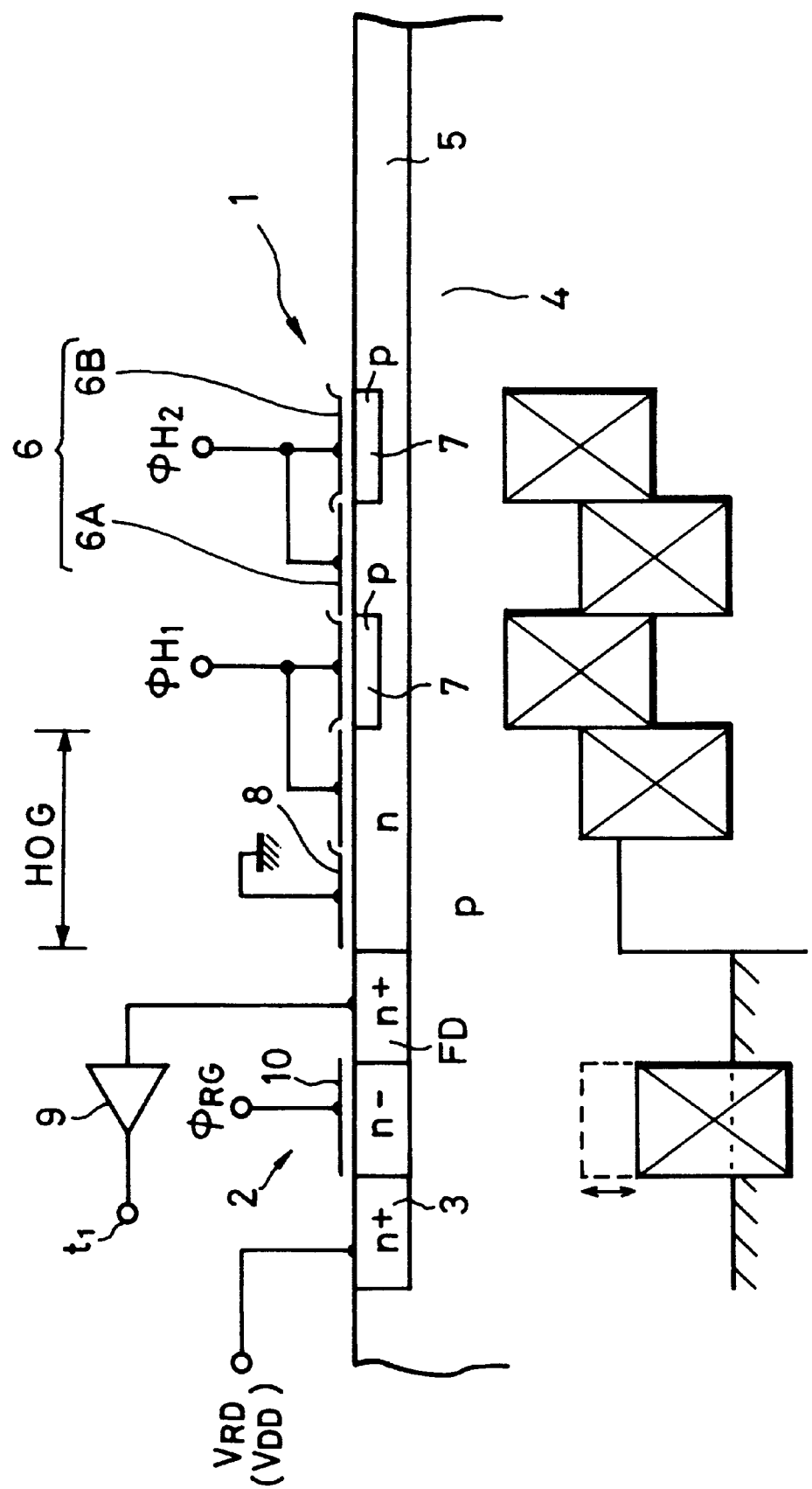
FIG. 2 is a schematic diagram showing a main portion of a CCD solid-state imaging device.
Figure 3:
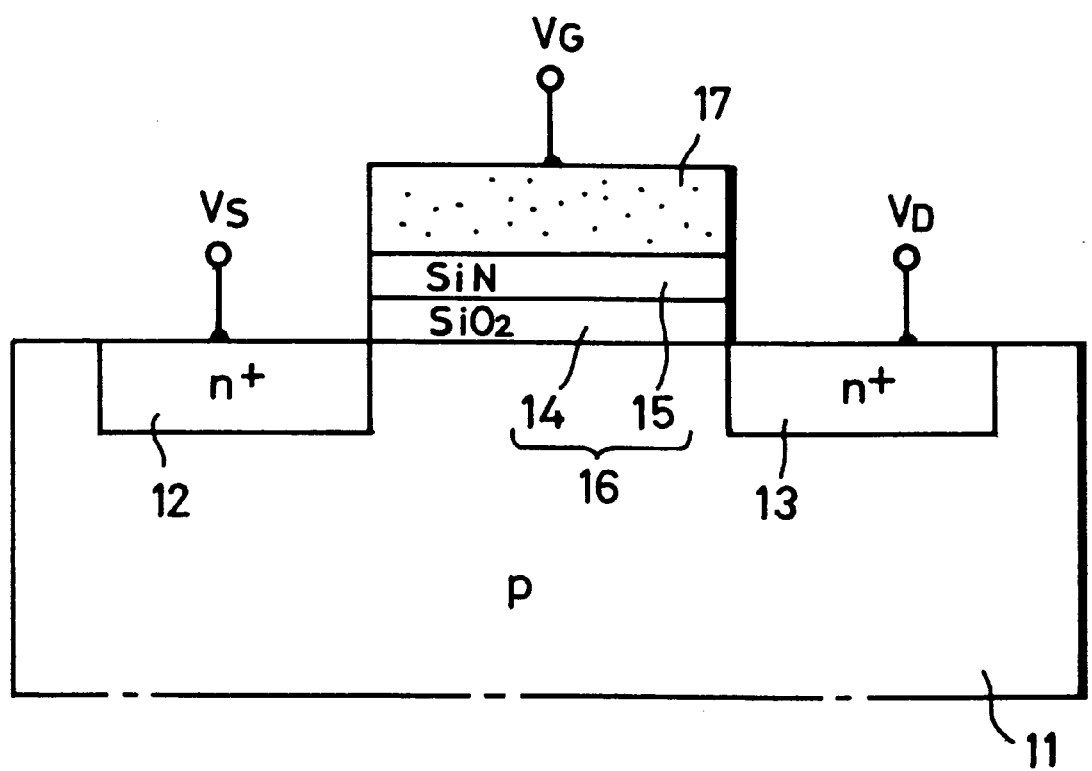
FIG. 3 is a schematic cross-sectional view showing an example of an ultraviolet-light-erasure read-only memory (ROM)
Figure 4:
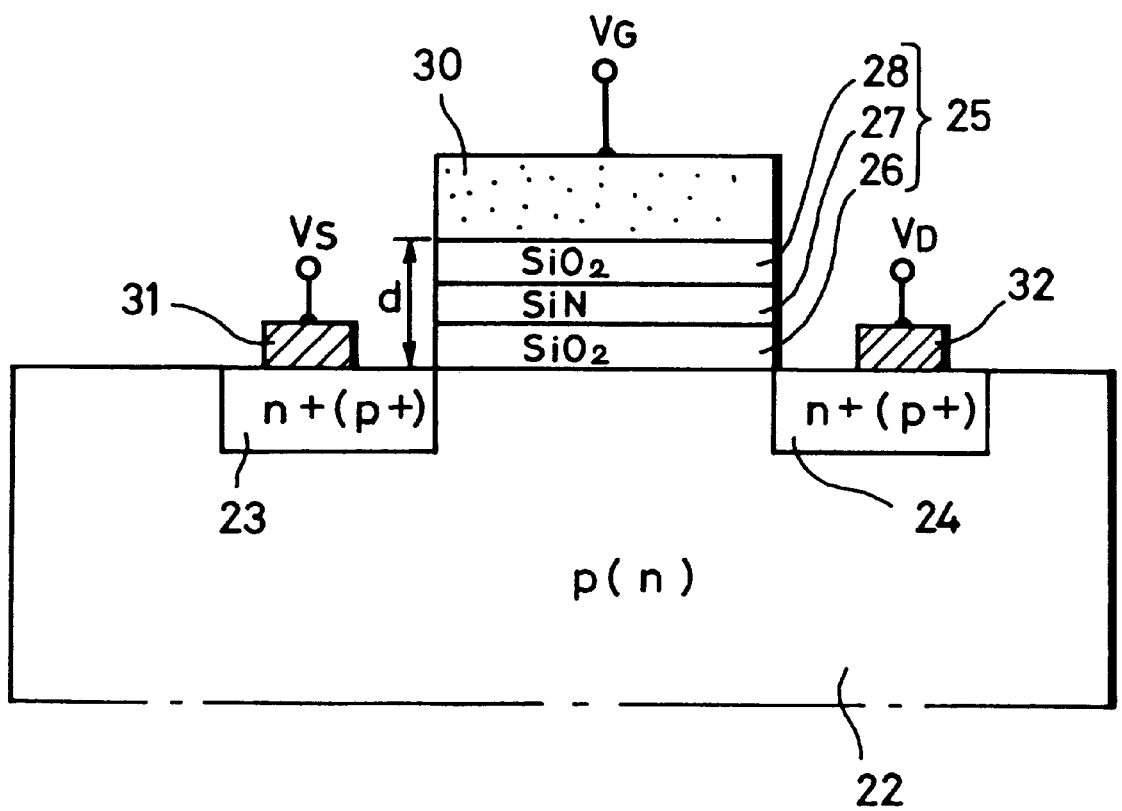
FIG. 4 is a schematic cross-sectional view showing a metal-insulator-semiconductor (MIS) device according to an embodiment of the present invention.

FIG. 4 is a cross-sectional view showing an inventive MIS device applied to a MISFET by way of example.

As shown in FIG. 4, a MISFET 21 according to this embodiment has a first conductivity-type (e.g., n-type or p-type) semiconductor region (semiconductor well and semiconductor base) 22 on which major surface there are formed second conductivity-type (p-type or n-type) source region 23 and drain region 24. Then, a gate insulating film 25 having a three-layer structure is formed by laminating an oxide film, e.g., silicon oxide film ($SiO_2$) 26, a nitride film, e.g., silicon nitride film (SiN) 27 and an oxide film, e.g., silicon oxide film ($SiO_2$) 28, in that order. This gate insulating film 25 is formed on the semiconductor region 22 at its major surface corresponding to the semiconductor region between the source region 23 and the drain region 24. A gate electrode 30 made of a polycrystalline silicon, for example, is formed on the gate insulating film 25. A source electrode 31 and a drain electrode 32 are formed on the source region 23 and the drain region 24, respectively.

In the MISFET 21 having a so-called MONOS (metal oxide nitride oxide semiconductor) structure, if electrons are accumulated in the silicon nitride film 27 in the gate insulating film 25, then this becomes equivalent to the fact that an offset of a predetermined negative potential is applied to a gate voltage $V_G$. Therefore, if the MISFET 21 is of the n-channel type, then potentials under the gate are moved in the so-called enhancement direction (direction in which potential becomes shallow). If on the other hand the MISFET 21 is of the n-channel type, then potentials under the gate are moved in the so-called depletion direction (direction in which potential become deep). Conversely, if holes are accumulated in the silicon nitride film 27 in the gate insulating film 25, then this becomes equivalent to the fact that an offset of a predetermined positive potential is applied to the gate voltage $V_G$. Therefore, if the MISFET 21 is of the n-channel type, potentials under the gate are moved in the depletion direction.

If on the other hand the MISFET 21 is of the p-channel type, then potentials under the gate are moved in the enhancement direction.

Figure 5:
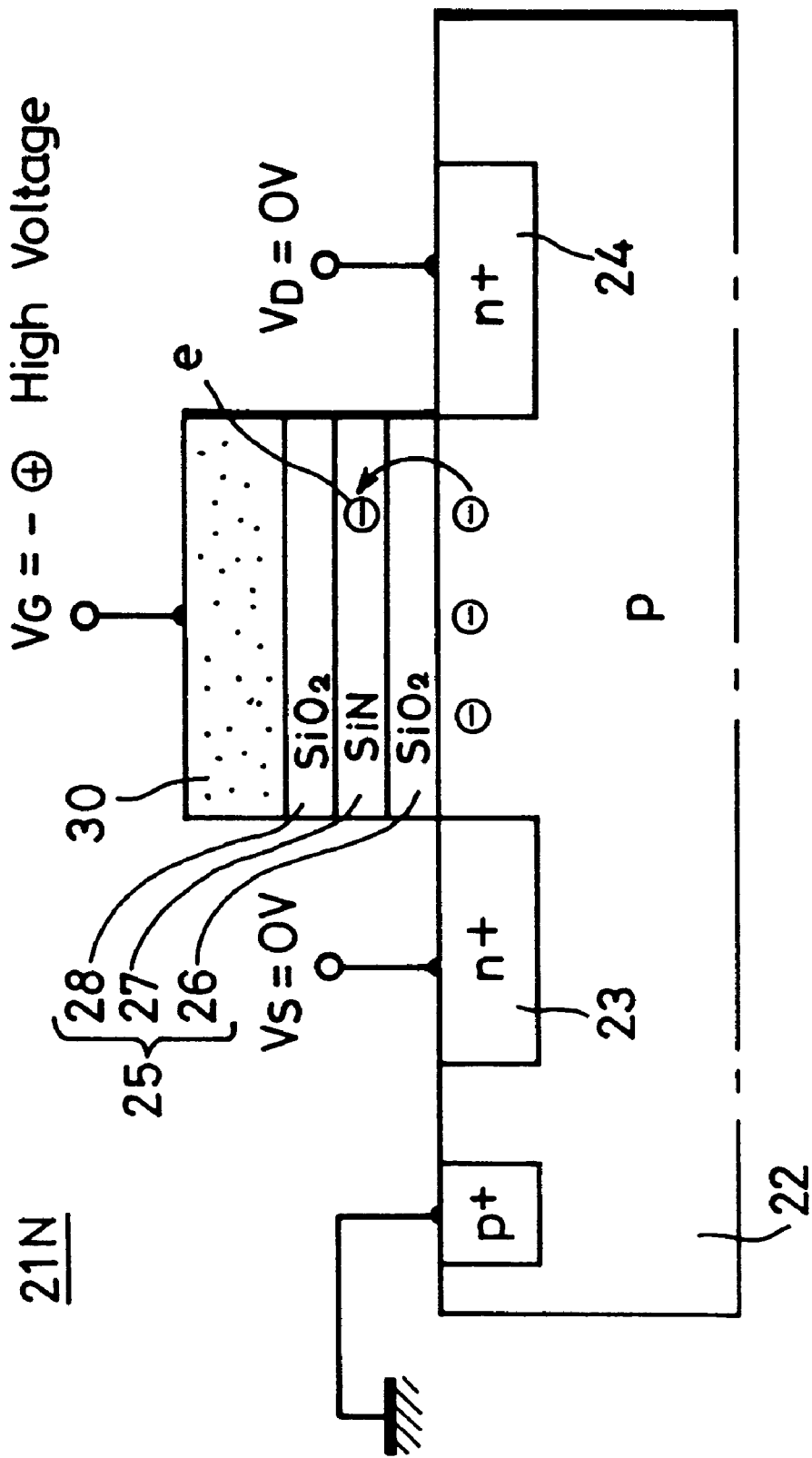
FIG. 5 is a schematic cross-sectional view used to explain a potential shift operation of an n-channel MIS device according to the present invention.

When the MISFET 21 is modified as an n-channel MISFET 21N having the MONOS structure as shown in FIG. 5, if a high voltage is applied to an interface between the gate electrode 30 and a channel region formed beneath the gate electrode 30, by way of example, if a source voltage $V_S$ and a drain voltage $V_D$ are both set to 0V (p-type semiconductor region 22 is, however, grounded) and a positive (+) high gate voltage (voltage higher than a normal drive voltage) is applied to the gate electrode 30 for a predetermined period of time, then electrons e of a certain constant amount are injected into the silicon nitride film 27 from the n+ layers forming the source region 23 and the drain region 24. The injected amount of electrons e depends on the voltage $V_G$ applied to the gate electrode 30 and a time during which the voltage $V_G$ is applied to the gate electrode 30. Therefore, it is possible to inject electrons e of a desired amount into the silicon nitride film 27 by controlling the voltage $V_G$ applied to the gate electrode 30 and the time during which the voltage $V_G$ is applied to the gate electrode 30. Specifically, the potentials are moved in the enhancement direction and therefore the desired potential or the threshold voltage $V_{th}$ can be obtained.

Figure 6:
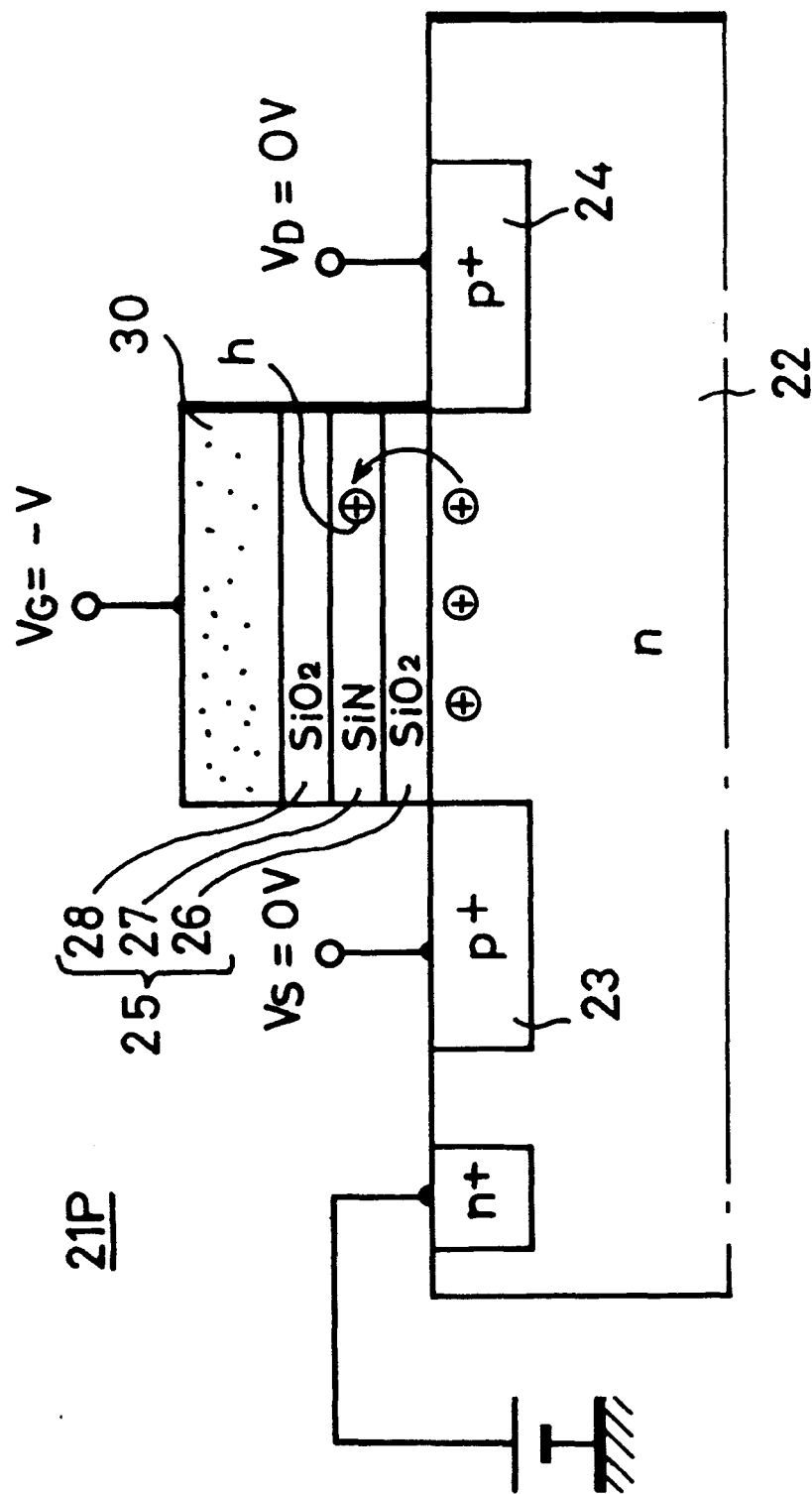
FIG. 6 is a schematic cross-sectional view used to explain a potential shift operation of a p-channel MIS device according to the present invention.

Conversely, when a– (negative) high gate voltage $V_G$ is applied to the gate electrode 30 of the n-channel MISFET 21N. if a p-type hole supply source is provided near the gate, then holes h are injected from the p-type hole supply source into the silicon nitride film 27 so that potentials are moved in the depletion direction. when the MISFET 21 is modified as a p-channel MISFET 21P having a MONOS structure as shown in FIG. 6, if the high voltage is similarly applied to the interface between the gate electrode 30 and the channel region formed beneath the gate electrode 30, by way of example, then the source voltage $V_S$ and the drain voltage $V_D$ are both set to 0V (n-type semiconductor region 22 is, however, applied with a predetermined positive voltage) and a– (negative) high gate voltage $V_G$ (voltage higher than a normal drive voltage) is applied to the gate electrode 30, then holes h are injected into the silicon nitride film 27 in the gate insulating film 25 from p+ layers forming the source region 23 and the drain region 24 and potentials are moved in the enhancement direction so that a desired potential or the threshold voltage $V_{th}$ can be obtained.

Also in this p-channel MISFET 21P, when the + (positive) high gate voltage $V_G$ is applied to the gate electrode 30, if an n-type electron supply source is disposed near the gate, then electrons e are injected into the silicon nitride film 27 from the p-type electron supply source so that potentials are moved in the depletion direction.

Signal charges, such as electrons and holes that had been injected into the silicon nitride film 27 are sandwiched by the lower and upper silicon oxide films 26 and 28 of the silicon nitride film 27 and difficult to escape from the silicon nitride film 27. when the MISFET 21 is driven by a normal drive voltage, the signal charges injected into the silicon nitride film 27 cannot cross the potential barrier and held in the silicon nitride film 27 permanently.

The MISFET 21 thus arranged can set the channel potential or the threshold voltage $V_{th}$ in an analogue fashion by controlling the amount in which signal charges are injected into the silicon nitride film 27 in the gate insulating film 25. Therefore, it becomes possible to use the MISFET 21 in an analogue circuit as an analogue MISFET.

The MIS device having the MONOS structure in which the potential or threshold voltage $V_{th}$ can be set in an analogue fashion is not limited to the application of MISFET and can be applied to an analogue memory device, a bias circuit for obtaining an output bias of a desired value or the like.

The MIS device having the MONOS structure can be applied to a reset gate portion of a solid-state imaging device, a charge transfer device or a charge detecting device or a transfer portion of a CCD transfer register.

Furthermore, the MIS device having the MONOS structure can be applied to setting a substrate voltage and a reset gate bias in the solid-state imaging device, the charge transfer device and the charge detecting device.

Figure 7:
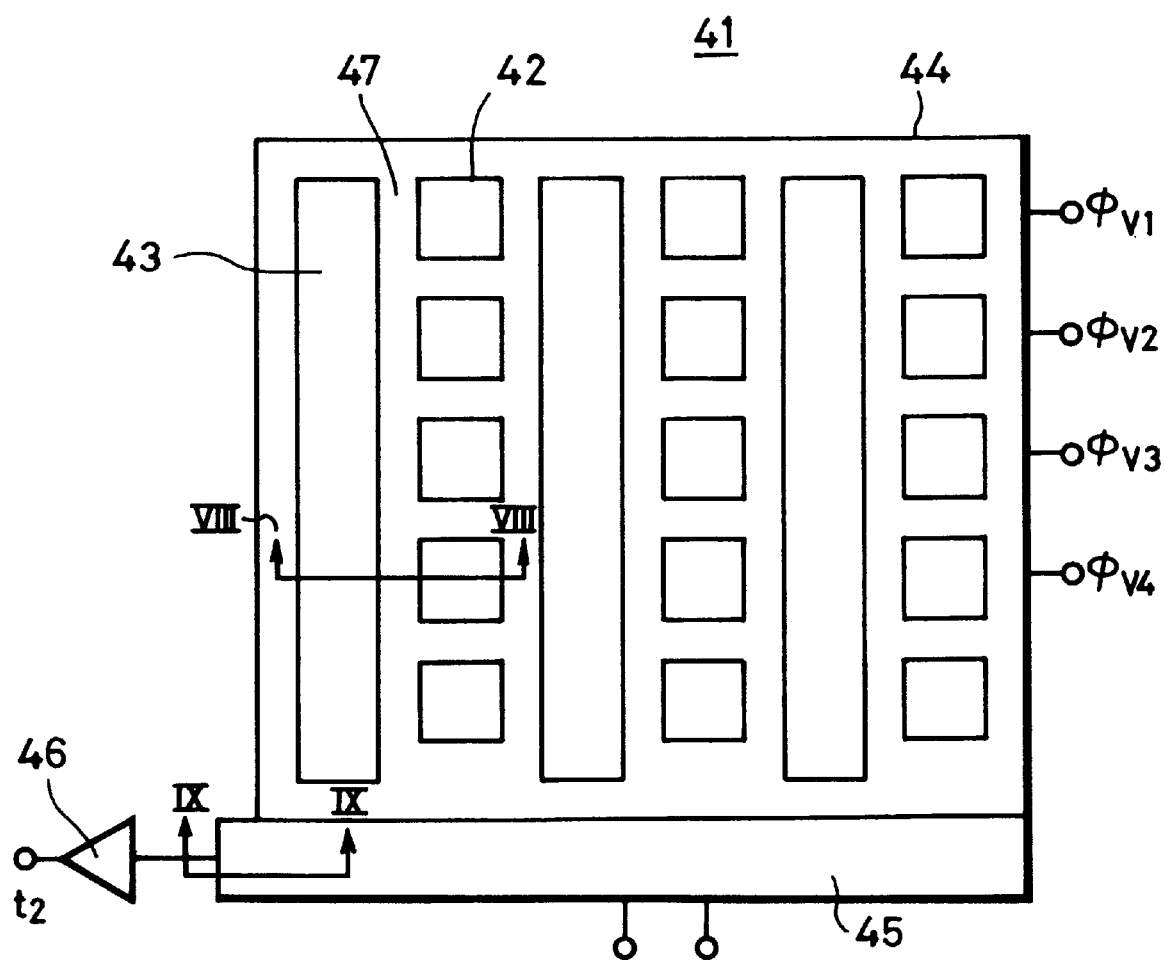
FIG. 7 is a schematic plan view showing an example of a CCD solid-state imaging device according to the present invention.
Figure 8:
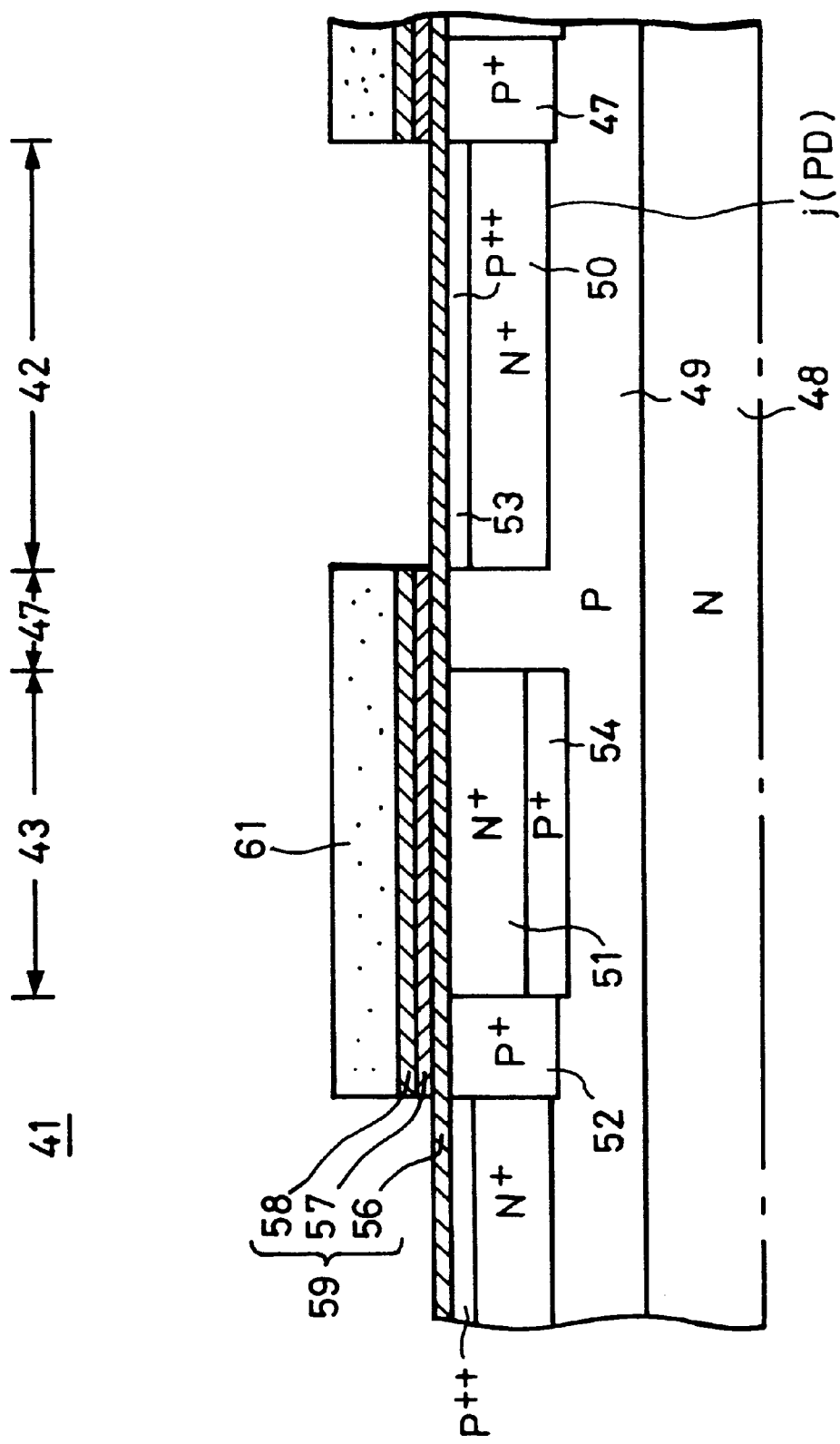
FIG. 8 is a cross-sectional view taken through the line VIII—VIII in FIG. 7.
Figure 9:
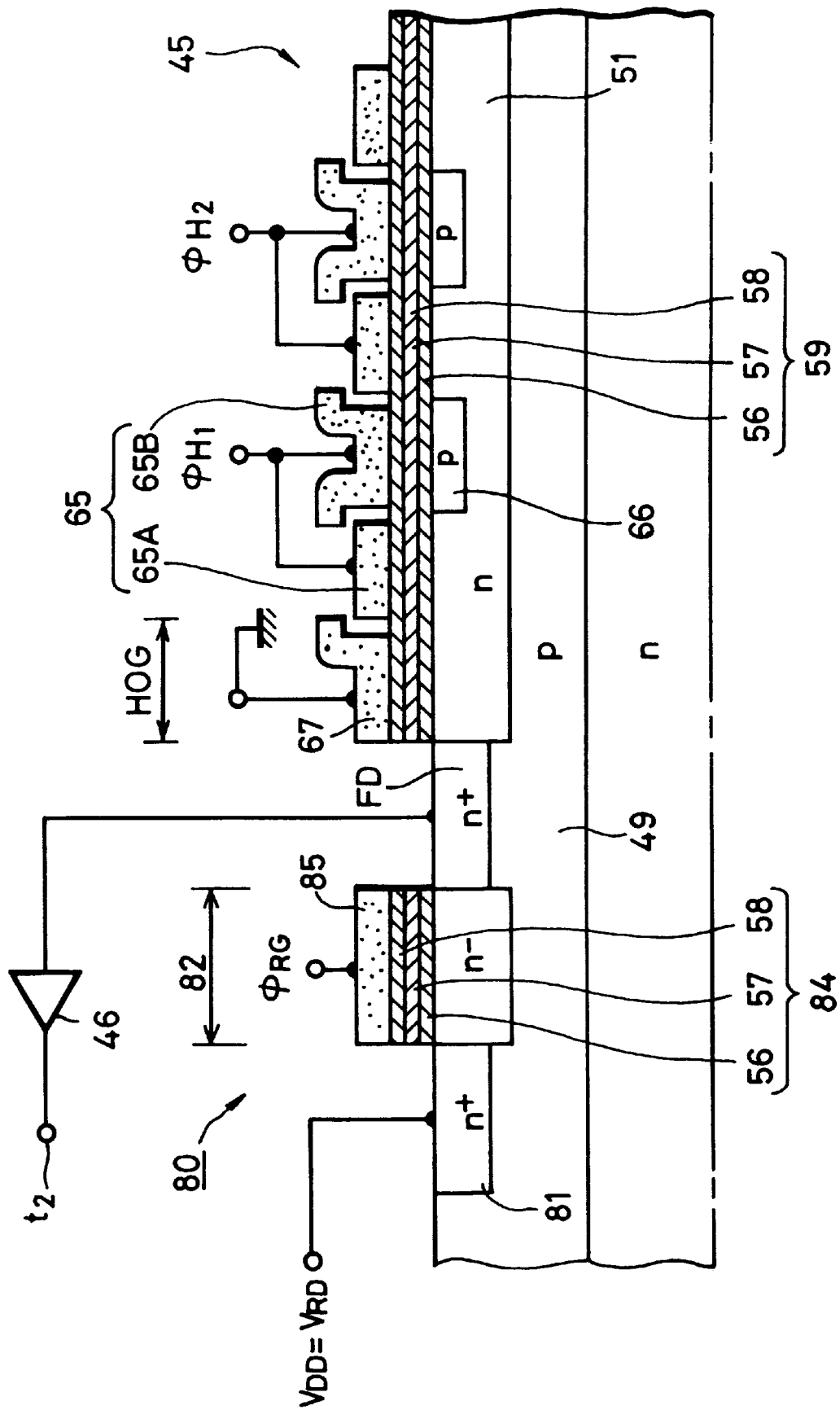
FIG. 9 is a cross-sectional view taken through the line IX—IX in FIG. 7.

FIGS. 7, 8 and 9 show an example of a CCD solid-state imaging device according to the present invention. In this embodiment, a potential of a reset gate portion is controlled by using, in particular, the MIS device, i.e., MIS device having the MONOS structure.

FIG. 7, 8 and 9 show the case that the MIS device having the MONOS structure is applied to a CCD solid-state imaging device of an interline transfer system. This CCD solid-state imaging device has a so-called vertical overflow structure wherein saturated electric charges are discharged in the substrate direction, i.e., in the longitudinal direction.

As shown in FIG. 7, a CCD solid-state imaging device 41 includes an imaging region 44 composed of a plurality of light-receiving portions (pixels) 42 arranged in a matrix fashion and a vertical transfer register 43 having a CCD structure disposed on one side of each column of the light-receiving portions 42, a horizontal transfer register 45 having CCD structure connected with the final stage of each vertical transfer register 43 and an output circuit connected to the output side of the horizontal transfer register 45, i.e., a charge detecting circuit 46 whose detected output is obtained at an output terminal $t_2$.

As shown in FIG. 8, in the imaging region 44, an n-type impurity diffusion region 50 forming the light-receiving portion 42, an n-type transfer channel region 51 forming the vertical transfer register 43 and a p-type channel region 52 are formed within a second conductivity-type, i.e., p-type well region 49 formed on a first conductivity-type, e.g., n-type silicon semiconductor substrate 48. A p-type positive charge accumulation region 53 is formed on the n-type impurity diffusion region 50 and a second p-type well region 54 is formed beneath the n-type transfer channel region 51.

The light-receiving portion (photoelectric conversion portion) 42 is formed of a photodiode PD composed of a pn junction formed between the n-type impurity diffusion region 50 and the p-type well region 49. A gate insulating film 59 of three-layer structure is formed by laminating a silicon oxide film ($SiO_2$) 56, a silicon nitride film ($Si_3N_4$) 57 and a silicon oxide film ($SiO_2$) 58, in that order. This gate insulating film 59 is formed over the transfer channel region 51 forming the vertical transfer register 43, a channel stopper region 52 and a read-out gate portion 47. A plurality of transfer electrodes 61 each formed of first and second polycrystalline silicon layers are arranged on the gate insulating film 59 along the transfer direction. The transfer channel region 51, the gate insulating film 59 and the transfer electrode 61 constitute the vertical transfer register 43.

The vertical transfer register 43 is driven by four-phase vertical drive pulses $\phi V_1$, $\phi V_2$, $\phi V_3$ and $\phi V_4$.

On the other hand, as shown in FIG. 9, the horizontal transfer register 45 is composed of an n-type transfer channel region 51, the gate insulating film 59 of three-layer structure formed of the silicon oxide film ($SiO_2$) 56, the silicon nitride film ($Si_3N_4$) 57 and the silicon oxide film ($SiO_2$), a plurality of first transfer electrodes 65A each formed of a first layer polycrystalline silicon layer and a plurality of second transfer electrodes 65B each formed of a second layer polycrystalline silicon layer, the first and second electrodes 65A and 65B being alternately arranged on the n-channel transfer region 51 through the gate insulating film 59 along the transfer direction.

In this horizontal transfer register 45, the adjacent two transfer electrodes 65A and 65B are paired and two-phase horizontal drive pulses $\phi H_1$, $\phi H_2$ are applied to every pair of the transfer electrodes 65 [65A, 65B] and every other pair of the transfer electrodes 65 [65A, 65B]. In the transfer channel region 51 formed beneath each of the second transfer electrode 65B, second conductivity-type, i.e., p-type semiconductor regions 66 are formed by implanting ions of impurity thereby to form a transfer portion which includes a storage portion using the first transfer electrode 65A as a storage electrode and a transfer portion using the second transfer electrode 65B as a transfer electrode.

Upon normal operation, in the gate insulating film 59, the silicon oxide film 58 prevents electric charges from being injected into the silicon nitride film 57 from the polycrystalline silicon electrode to avoid the occurrence of potential shift.

As shown in FIG. 9, a horizontal output gate portion HOG having a gate electrode 67 formed of a second layer polycrystalline silicon film through the gate insulating film 59 is formed behind the transfer portion of the final stage of the horizontal transfer register 45. A fixed output gate voltage, e.g., ground potential (GND) is applied to the horizontal output gate portion HOG. A charge detecting device 80 is formed at the succeeding stage of the horizontal output gate portion HOG. The charge detecting device 80 includes a floating diffusion region FD adjoining the horizontal output gate portion HOG and which is formed of an n-type semiconductor region to accumulate signal charges, a reset gate portion 82 adjoining the floating diffusion region FD to reset signal charges accumulated in the floating diffusion region FD, a reset drain region 81 and an output circuit (detecting circuit) 46 connected to the floating diffusion region FD to detect signal charges accumulated in the floating diffusion region FD. A detected output from the output circuit 46 is supplied to the output terminal $t_2$.

The reset drain region 81 is formed of an n-type semiconductor layer to which a reset voltage $V_{RD}$ (e.g., power supply voltage $V_{DD}$) is applied. A reset pulse $\phi_{RG}$ is applied to the reset gate portion 82.

In this embodiment, the reset gate portion 82 is composed of the p-type well region 49, a gate insulating film 84 of three-layer structure formed by laminating the silicon oxide film (SiO$_2$) 56, the silicon nitride film (Si$_3$N$_4$) 57 and the silicon oxide film (SiO$_2$) 58, in that order, at the same time when the gate insulating film 59 of the vertical and horizontal transfer registers 43, 45 is formed, and a gate electrode 85 made of a polycrystalline silicon film formed on the p-type well region 49 through the gate insulating film 84. Specifically, the reset gate portion is formed as the MIS device having the MONOS structure. In this case, the reset gate portion 82, the floating diffusion region FD and the reset drain region 81 constitute the MIS device having the MONOS structure, i.e, MISFET.

In this CCD solid-state imaging device 41, a signal charge, photoelectrically converted by each light-receiving portion 42 in response to an amount of light received by the light-receiving portion 42, is read out to the vertical transfer register 43 and transferred through the vertical transfer register 43 to the horizontal transfer register 45. The signal charge transferred to the horizontal transfer register 45 is transferred at every pixel to the floating diffusion region FD and converted by the output circuit 46 in the form of electric charge to voltage, whereafter it is read out from the output terminal $t_2$ a s a CCD output.

After the signal charge of one pixel has been read out, the signal charge in the floating diffusion region FD is discharged through the reset gate portion 82 to the reset drain region 81 on application of the reset pulse $\phi_{RG}$. Then, the potential of the floating diffusion region FD is reset to the potential of the reset drain region 81.

In the CCD solid-state imaging device 41 according to this embodiment, as shown by a potential distribution 89 (FIG. 10) obtained before a potential shift is adjusted, when a potential $\phi_m$ under the reset gate portion 82 becomes deep due the potential shift in the manufactured product, the potential is adjusted as follows.

Specifically, the potential $\phi_m$ ($\phi_{m1}$) under the reset gate portion 82 is detected and the detected potential $\phi_{m1}$ is compared with a reference value $\phi_{m2}$ (i.e., value of potential to be set).

Then, electric charges of an amount that is large enough to correct a difference between the detected potential $\phi_{m1}$ and the reference value $\phi_{m2}$ are injected into the silicon nitride film 57 of the gate insulating film 84. More specifically, the reset voltage $V_{RD}$ of the reset drain region 81 is set to 0V, a predetermined + (positive) high voltage $V_{RD}$ set in accordance with the difference is applied to the gate electrode 85 of the reset gate portion 82 for a predetermined period of time, whereafter electrons of an amount suitable enough to correct the difference between the detected potential (61 and the reference value As are injected into and accumulated in the silicon nitride film 57 of the gate insulating film 84.

In actual practice, observing a waveform of an image output, electric charges are injected into the silicon nitride film 57 until the waveform of the image output becomes correct.

By the electrons accumulated in the silicon nitride film 57, the potentials obtained under the reset gate portion 82 can be moved in the enhancement direction, accordingly, in the direction in which the potential becomes shallow from the potential $\phi_{m1}$ obtained immediately after the CCD solid-state imaging device was manufactured (before a potential is adjusted) as shown by a potential distribution 90 (FIG. 10) obtained after the potential $\phi_{m1}$ was adjusted. Thus, the potential $\phi_{m1}$ can be adjusted to a normal potential $\phi_{m2}$.

Since the terminal of the reset drain region 81 and the terminal of the reset gate portion 82 are external terminals, it is necessary to avoid the potential from being shifted due to a static electricity. It is customary that protecting devices (e.g., diodes and transistors) are added to these external terminals in order to prevent a high voltage from being applied to these external terminals. Potentials cannot be adjusted under the condition that the protecting devices are added to the external output terminals.

Therefore, only when the potential is adjusted, the protecting device is detached from the external output terminal or a blocking voltage is raised to de-energize the protecting device, thus to make it possible to adjust the potential. After potential has been adjusted, the protecting device is energized by connecting the protecting device to the external output terminal one more time. Thereafter, the adjusted value has to be kept in this state.

A specific example of such protecting device will be described with reference to FIG. 9. As shown in FIG. 9, a protecting device 86 is formed on the same semiconductor wafer together with an imaging device body. The protecting device 86 is composed of a pair of diodes PD connected in series. One end of the protecting device 86 is connected to a power supply voltage $V_{DD}$ and the other end thereof is connected to the ground (GND). A junction between the two photodiodes PD is connected to an external output terminal 87. Under the wafer state, the external output terminal 87 connected to a gate electrode 85 of the reset gate portion 82 and the protecting device 86 are placed in the disconnected state. When the CCD solid-state imaging device is inspected in the wafer state, the potential $\phi_m$ is adjusted. When the CCD solid-state imaging device is assembled, the external output terminal 87 and the protecting device 86 are connected by a wire bonding 88. Therefore, even when a static electricity is applied to the external output terminal 85 after the CCD solid-state imaging device was shipped, the protecting device 86 c an prevent the static electricity from being applied to the reset gate portion 82. Thus, it is possible to protect the CCD solid-state imaging devices from a trouble occurred after they have been shipped.

According to the CCD solid-st ate imaging device 41 show n in FIGS. 7 through 10, the reset gate portion 82 having the MONOS structure includes the gate insulating film 84 of three-layer structure composed of the silicon oxide film 56, the silicon nitride film 57 and the silicon oxide film 58. Electric charges of a desired amount are injected into and accumulated in the silicon nitride film 57 of the gate insulating film 84 in an analogue fashion, whereby the potential $\phi_m$ under the reset gate portion 82 can be adjusted in an analogue fashion.

Therefore, the potential need not be adjusted after the CCD solid-state imaging device has been completed unlike the prior art in which the potential has to be adjusted by an external circuit or the like after the CCD solid-state imaging device has been completed. Moreover, the amplitude of the reset pulse $\phi_{RG}$ can be lowered in order to reduce a power consumption.

When the substrate voltage $V_{sub}$ of the CCD solid-state imaging device is set, since the CCD solid-state imaging device has the substrate having the pn junction and is not formed as the MIS transistor, the potential cannot be adjusted directly unlike the reset gate portion 82.

In that case, an adjusting circuit, i.e., a bias circuit for adjusting a potential is additionally provided. This bias circuit is composed of the MIS device having the MONOS structure. An output bias value from the bias circuit is adjusted by adjusting a channel potential of the MIS device. Then, this output bias value is applied to the substrate 48 of the CCD solid-state imaging device.

While the potential $\phi_m$ under the reset gate portion 82 is directly adjusted as described above, the present invention is not limited thereto and the potential $\phi_m$ can be adjusted indirectly. Because the potential shift $\phi_m$ can be considered to be the same as the shift of the DC bias $V_{RG}$ applied to the gate electrode 85, the DC bias $V_{RG}$ applied to the gate electrode 85 of the reset gate portion 72 may be controlled by the above bias circuit.

Figure 11A:
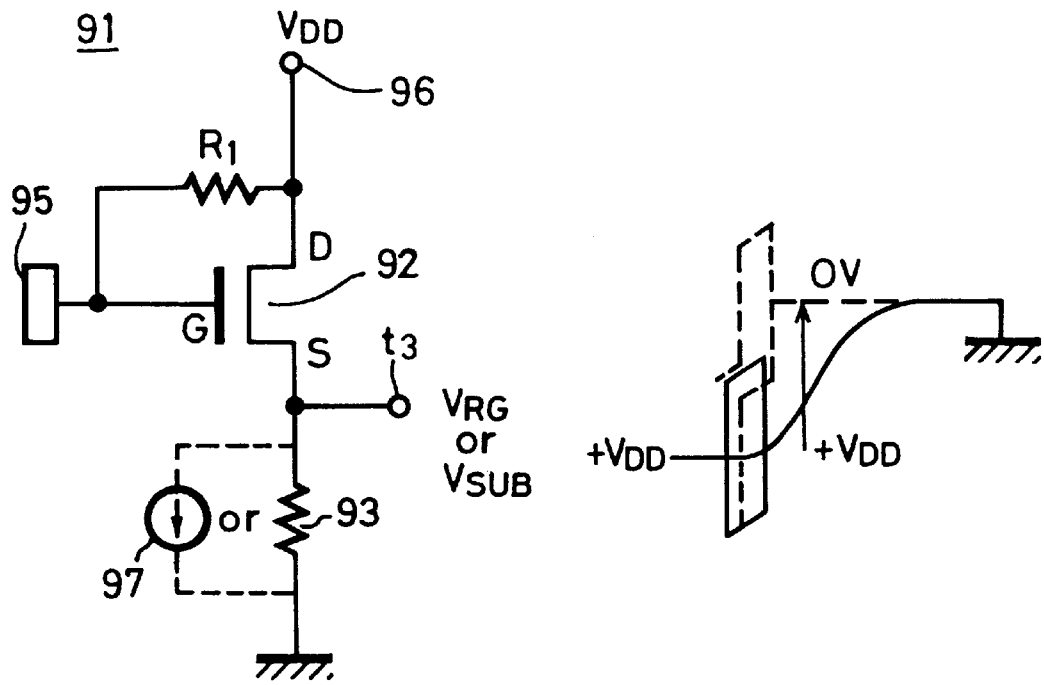
FIG. 11A is a circuit diagram showing an example of a source-follower bias circuit according to the present invention.

FIG. 11A shows an example of a bias circuit. As shown in FIG. 11A, a bias circuit 91 is of a source-follower circuit type composed of a drive MIS transistor 92 and a load resistor 93.

The drive MIS transistor 92 is formed of a MISFET having the MONOS structure shown in FIG. 4, e.g., the n-channel MISFET 21N shown in FIG. 5.

The drain D of the drive MIS transistor 92 is connected to a power supply terminal 96 to which the power supply voltage $V_{DD}$ is applied. The other end of the load resistor 93 is connected to the ground (GND). An output terminal $t_3$ of this bias circuit 91 is led out from the source S of the drive MIS transistor 92.

The gate G of the drive MIS transistor 92 is connected through a resistor RI to the drain D (power supply source) so that a particular gate bias is applied to the gate G.

Figure 11B:
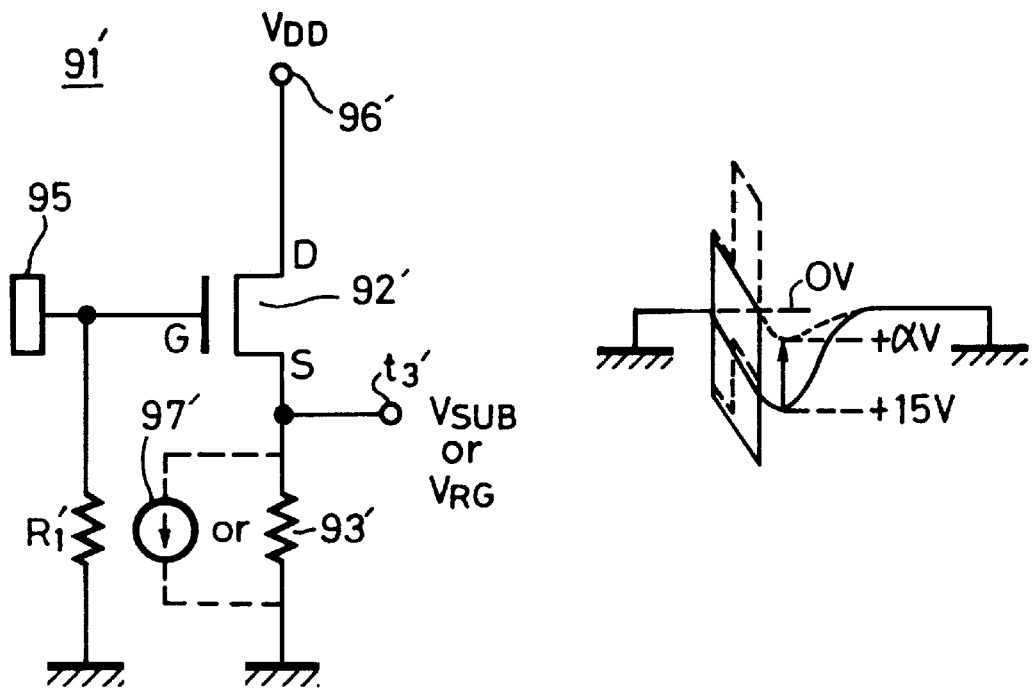
FIG. 11B is a circuit diagram showing another example of the source-follower bias circuit according to the present invention.

FIG. 11B shows another example of a bias circuit 91'. As shown in FIG. 11B, the gate G of a drive MISFET transistor 92' is connected through a resistor $R_1'$ to the ground (GND) so that a particular gate bias is applied to the gate G.

Since the bias circuits 91 and 91' shown in FIGS. 11A and 11B differ from each other only in the connections of the resistors $R_1$ and $R_1'$, in FIG. 11B, like parts corresponding to those of FIG. 11A are marked with the same references with dashes and therefore need not be described in detail.

Although it is customary that the gate G is directly connected to a power supply source and the ground (GND) without a resistor if a circuit is formed on a semiconductor chip, when a high voltage is applied to the gate G, the drain D is held at 0V and a high voltage is applied to a gate terminal 95 as will be described later on. Therefore, the resistor $R_1$ is required in order to protect the MIS transistor 92 from being broken even when a high voltage is applied to the MIS transistor 92. Inasmuch as the resistor $R_1$ can withstand a high voltage, the resistor $R_1$ might be formed of a variety of resistors, such as a polycrystalline silicon resistor, a diffusion resistor or a MIS resistor.

In the bias circuit 91, an initial output (potential) of the drive MIS transistor 92 is set such that the gate voltage $V_G$ becomes nearly equal to the source voltage Vs (i.e., threshold voltage $V_{th}$ is held at 0V). In the bias circuit 91', an initial output of the drive MIS transistor 92' is set such that the initial output becomes nearly equal to the power supply voltage ($V_{DD}$) ($V_{th} \approx -V_{DD}$) when the gate voltage $V_G$ is equal to 0V. Then, $V_{DD}=V_{sub}$ (or $V_{RG}$)=0V (i.e., the power supply terminals 96, 96' and the output terminals $t_3$, $t_3'$ are held at 0V) and the high voltage is applied to the gate terminals 95, 95', whereafter the potential under the gate can be adjusted to be a desired one by injecting electric charges into the silicon nitride film 27 of the gate insulating film 25.

An output bias voltage supplied to the output terminal $t_3'$ of the bias circuit 91' is applied to the substrate as the substrate voltage $V_{sub}$ of the CCD solid-state imaging device.

As a consequence, the value of the substrate voltage $V_{sub}$ can be varied in a range from the power supply voltage $V_{DD}$ to a voltage of $+\alpha V$. Specifically, if the drive MIS transistor 92' is set in the depletion state where $V_{th}=-V_{DD}$, then the output of the drive MIS transistor 92' becomes the power supply voltage $V_{DD}$. Then, the output is progressively lowered as the potential is adjusted in the enhancement direction. If the potential on the Si (silicon) surface of the drive MIS transistor 92' is fixed, then the output reaches near $+\alpha V$ and can be varied in a range of from about $V_{DD}$ to $+\alpha V$.

The output bias voltage supplied to the output terminal $t_3$ of the bias circuit 91 is applied to the reset gate electrode as the DC bias $V_{RG}$ of the reset gate portion of the CCD solid-state imaging device.

As a result, the value of the DC bias voltage $V_{RG}$ applied to the reset gate portion can be varied in a range of from the power supply voltage $V_{DD}$ to 0V. Specifically, if the drive MIS transistor 92 is set in the depletion state and turned on, then the output thereof becomes the power supply voltage $V_{DD}$. Then, as the potential is adjusted in the enhancement direction, the output of the drive MIS transistor 92 is lowered. If the drive MIS transistor 92 is turned off completely, the output thereof becomes 0V and can be varied in a range of from the power supply voltage $V_{DD}$ to 0V.

The load resistors 93, 93' forming the source-follower circuits are not limited to the load resistors and might be formed of constant current sources 97, 97' as shown by dashed line in FIGS. 11A, 11B. If the load resistors 93, 93' are formed of the constant current sources, a linearity of input and output characteristics can be improved more.

When the adjusting circuits, i.e., the bias circuits 91, 91' are incorporated in the semiconductor chip of the CCD solid-state imaging device, the gate terminals 95, 95' of the drive MIS transistor 92 whose potential has to be adjusted need not be led out to the outside. Therefore, if the potentials under the gates of the drive MIS transistors 92, 92' are adjusted when the semiconductor wafer is inspected, then the protecting devices need not be added to the gate terminals 95, 95' when or after the CCD solid-state imaging devices are assembled. In this case, however, the power supply terminals 96, 96' need protecting devices.

Inasmuch as the input gate of the bias circuit 91' is grounded so that an output of the bias circuit 91' is difficult to be fluctuated even when the power supply voltage is fluctuated, the bias circuit 91' becomes suitable for the bias circuit for applying the substrate voltage $V_{sub}$ to the CCD solid-state imaging device.

In the above bias circuit 91, the output bias is fluctuated substantially similarly with the fluctuation of the power supply voltage $V_{DD}$. Accordingly, when the bias circuit 91 is used to supply the substrate potential $V_{sub}$ to the CCD solid-state imaging device, if the power supply voltage $V_{DD}$ is fluctuated, then the substrate voltage $V_{sub}$ also is fluctuated, resulting in a height of an overflow barrier being fluctuated. There is then the risk that the amount of electric charges treated at the light-receiving portion is changed considerably.

When on the other hand the bias circuit 91 is used to adjust the DC bias $V_{RG}$ of the reset gate portion 82, if the power supply voltage $V_{DD}$ which becomes the reset drain voltage $V_{RD}$ is fluctuated, then the gate voltage $V_G$ of the drive MIS transistor 92 of the bias circuit 91 also is fluctuated with the result that the output bias value, accordingly, the DC bias value of the reset gate is fluctuated with the same fluctuated amount as that of the power supply voltage $V_{DD}$, which therefore brings about an advantage.

Specifically, the bias circuit can follow the power supply voltage more satisfactorily and the source-follower type bias circuit 91 becomes the best bias circuit for applying a potential adjustment DC bias to the reset gate portion.

Figure 12:
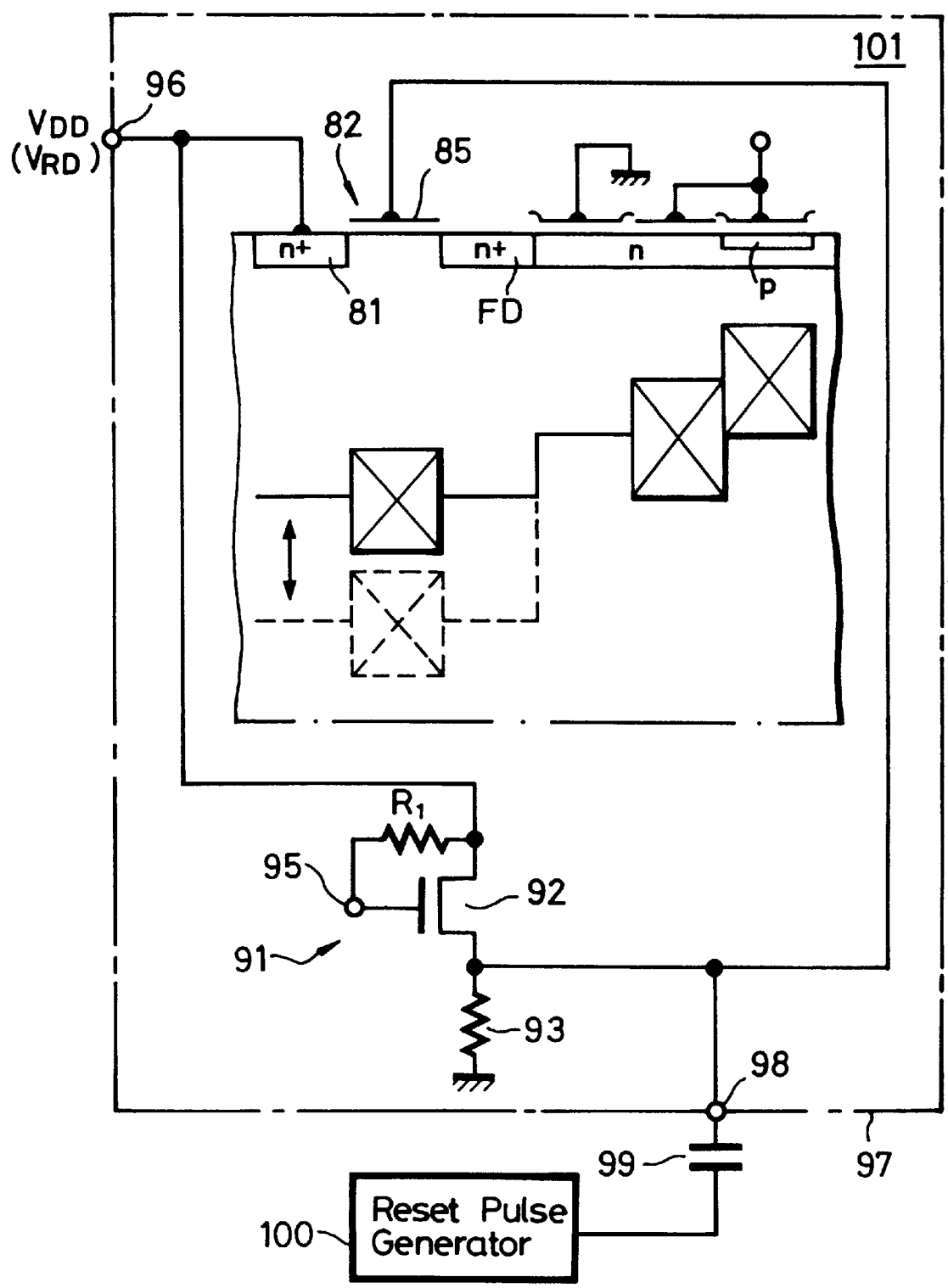
FIG. 12 is a schematic diagram showing a main portion of a CCD solid-state imaging device using the bias circuit shown in FIG. 11A or 11B according to the present invention.

FIG. 12 is a circuit, partly in cross-sectional form, diagram showing the embodiment wherein the above bias circuit 91 is applied to the case that a potential of the reset gate portion 82 of the CCD solid-state imaging device is adjusted (i.e, DC bias is adjusted). In FIG. 12, elements and part identical to those of FIGS. 7 to 9 are marked with the same references and therefore need not be described in detail.

In a CCD solid-state imaging device 101 according to this embodiment, as shown in FIG. 12, a semiconductor chip 97 forming the CCD solid-state imaging device 101 incorporates the above source-follower type bias circuit 91. The drain of the drive MIS transistor 92 is connected to the power supply terminal 96 connected to the reset drain region 81. The power supply voltage $V_{DD}$ which becomes the reset drain voltage $V_{RD}$ is applied to the reset drain region 81 through the power supply terminal 96.

The source of the drive MIS transistor 92 is connected to the gate electrode 85 of the reset gate portion 82 and further connected through an external capacitor 99 disposed outside the semiconductor chip 97 to a reset pulse generator 100. In FIG. 12, reference numeral 98 designates an external terminal.

The reset gate portion 82 does not need a special gate insulating film because electric charges need not be injected into the gate insulating film. Therefore, the gate insulating film might be an insulating film of the above three-layer structure or insulating films of other structures.

According to the embodiment shown in FIG. 12, the potential $\phi_m$ under the reset gate portion 82 is measured when the wafer is inspected. If the measured potential $\phi_m$ is different from the reference value $\phi_{m2}$, then the channel potential of the drive MIS transistor 92 is adjusted by injecting electric charges of an amount sufficient enough to correct such difference of potentials into the gate insulating film of the drive MIS transistor 92 in the bias circuit 91 by the above-mentioned method. Thus, an output bias voltage of a desired value can be output from the bias circuit 91 and applied to the reset gate portion 82 as the DC bias voltage $V_{RG}$, resulting in the potential $\phi_m$ under the reset gate portion being adjusted.

The reset gate electrode 85 is applied with a reset pulse $\phi_{RG}$ with a reset pulse high frequency component superimposed thereon from the reset pulse generator 100.

Figure 15:
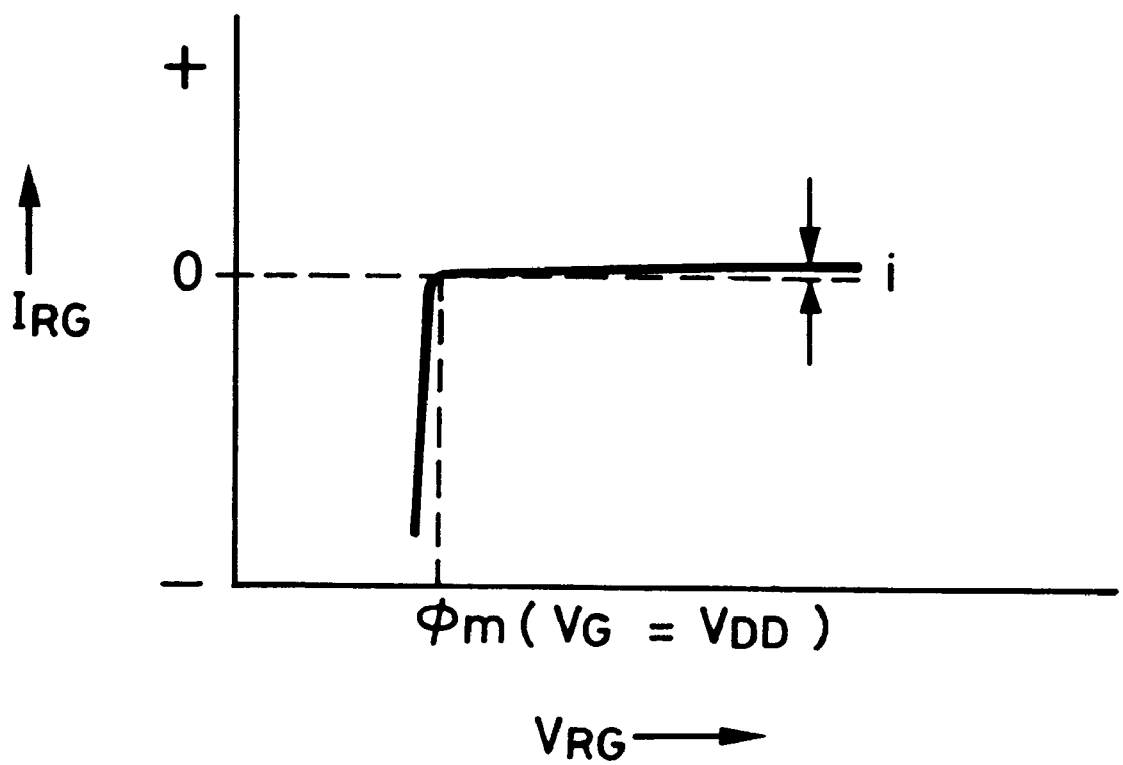
FIG. 15 is a characteristic graph showing measured results of voltage versus current characteristics in the equivalent circuit shown in FIG. 14.

Inasmuch as the drive MIS transistor 92 is driven in the enhancement state after the potential $\phi_m$ has been adjusted, if a load current i is minimized, then the bias circuit 91 becomes equivalent to a low-clamping circuit 98 formed of a diode D as seen from the terminal $t_3$ (see FIGS. 13 and 14). FIG. 15 is a characteristic graph of voltage versus current characteristics of the equivalent circuit 98 shown in FIG. 14. If the drive MIS transistor 92 is driven in the depletion state, then the drive MIS transistor 92 does not act as the diode D and is given a resistance characteristic. As a result, the drive MIS transistor 92 become an average-value clamping circuit so that a reset gate voltage is fluctuated as the amplitude and duty ratio of the reset pulse are fluctuated. There are then the problems that the floating diffusion region FD suffers from the insufficient amount of the saturated signals and that the reset gate pulse becomes unsatisfactory. If however the low-clamping circuit 98 is used as the bias circuit 91, then even when the amplitude and duty ratio of the reset gate pulse are fluctuated, the low-level voltage of the reset gate pulse becomes constant, thereby preventing the amount of the saturated signals from becoming insufficient.

Therefore, according to the CCD solid-state imaging device 101, since the potential under the reset gate portion 82 also is shifted as the power supply voltage $V_{DD}$ is fluctuated, even when the power supply voltage $V_{DD}$ is fluctuated, a potential difference between the potential under the reset gate portion 82 and the potential in the reset drain region 81 can be prevented from being shifted.

In the bias circuit 91, if the potential shift amount is large, then $V_G \gg V_S$. Therefore, a gate-source potential difference increases and there is the problem whether the bias circuit 91 can withstand a high voltage when the bias circuit 91 is operated in actual practice. In the bias circuit 91', in the initial stage, $V_G \ll V_D$ is satisfied and a gate-drain potential difference increases and there is then the similar problem whether the bias circuit 91' can withstand a high voltage. A fluctuation of the substrate voltage $V_{sub}$, for example, is as large as several Volts and has to be adjusted in a range from nearly 10V.

Figure 16:
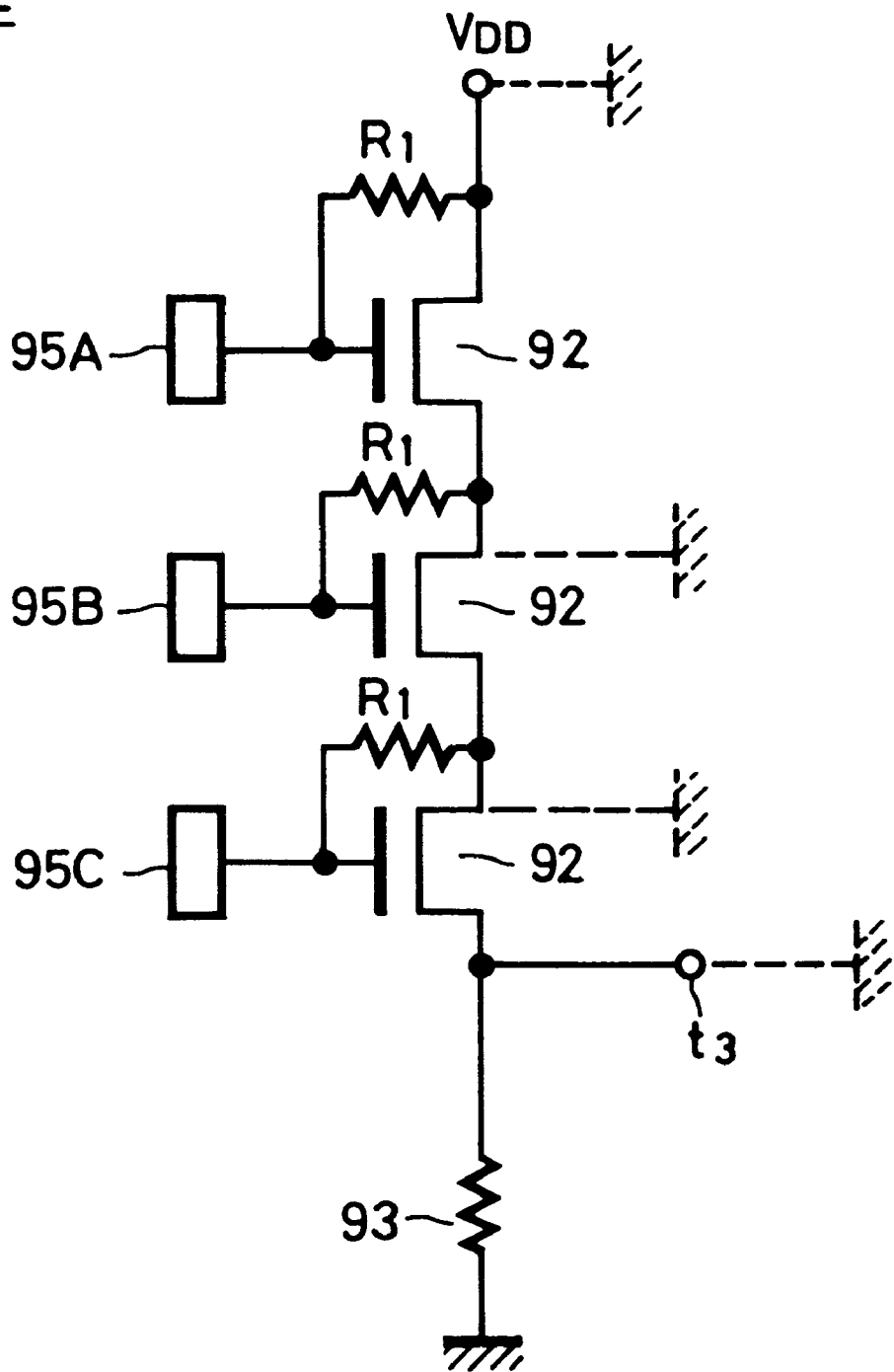
FIG. 16 is a circuit diagram showing an example of a bias circuit composed of a number of MIS transistors connected in series.

FIG. 16 shows an example of a bias circuit according to the present invention wherein the above-mentioned problem can be solved. As shown in FIG. 16, a bias circuit 102 according to this embodiment is a source-follower type bias circuit composed of a number of (three in this embodiment) the drive MIS transistors 92 having the MONOS structure connected in series and the load resistor 93 connected to the source of the drive MIS transistor 92 of the final stage. This bias circuit 102 supplies its output to an output terminal $t_3$. The resistor $R_1$ is connected between the gate and the drain of each drive MIS transistor 92. Gate terminals 95 [95A, 95B, 95C] are respectively led out from the gates of the drive MIS transistors 92.

When a channel potential of each drive MIS transistor 92 is adjusted, the drain of each drive MIS transistor 92, the power supply terminal $V_{DD}$ and the output terminal $t_3$ are grounded as shown by a dotted line to apply a desired high voltage to each of the gate terminals 95 [95A, 95B, 95C] thereby to adjust the channel potential of each drive MIS transistor 92.

According to the bias circuit thus arranged, a potential shift amount of the drive MIS transistor 92 per stage can be reduced, i.e., the adjustment range can be reduced with the result that a total amount of a potential shift, accordingly, the adjustment range can be expanded. Simultaneously, it is possible to avoid the drive MIS transistor 92 from being deteriorated in withstanding a high voltage among the gate-source and drain when the drive MIS transistor 92 is operated in actual practice.

Specifically, if all drive MIS transistors 92 are set in the depletion state and turned on, then the initial output from the output terminal $t_3$ becomes the power supply voltage $V_{DD}$. Then, the output is progressively lowered as the potential is adjusted in the enhancement direction (direction in which the potential becomes shallow). If each drive MIS transistor 92 is completely turned off, the output becomes 0V. Therefore, the potential can be adjusted in a wide range from the power supply voltage $V_{DD}$ to 0V and the problem that the drive MIS transistor 92 cannot withstand a high voltage can be solved.

The bias circuit 91 of the first stage of the drive MIS transistor 92 shown in FIG. 11A is suitable for adjusting a potential of the reset gate portion wherein a fluctuation of potential is small and a potential shift amount also is small.

The bias circuit 102 composed of the drive MIS transistors 92 connected in multiple stages is suitable for adjusting a potential of a portion in which a fluctuation of potential is large, such as the substrate voltage $V_{sub}$. However, the problem of the fluctuation of voltage cannot be avoided yet.

Figure 17:
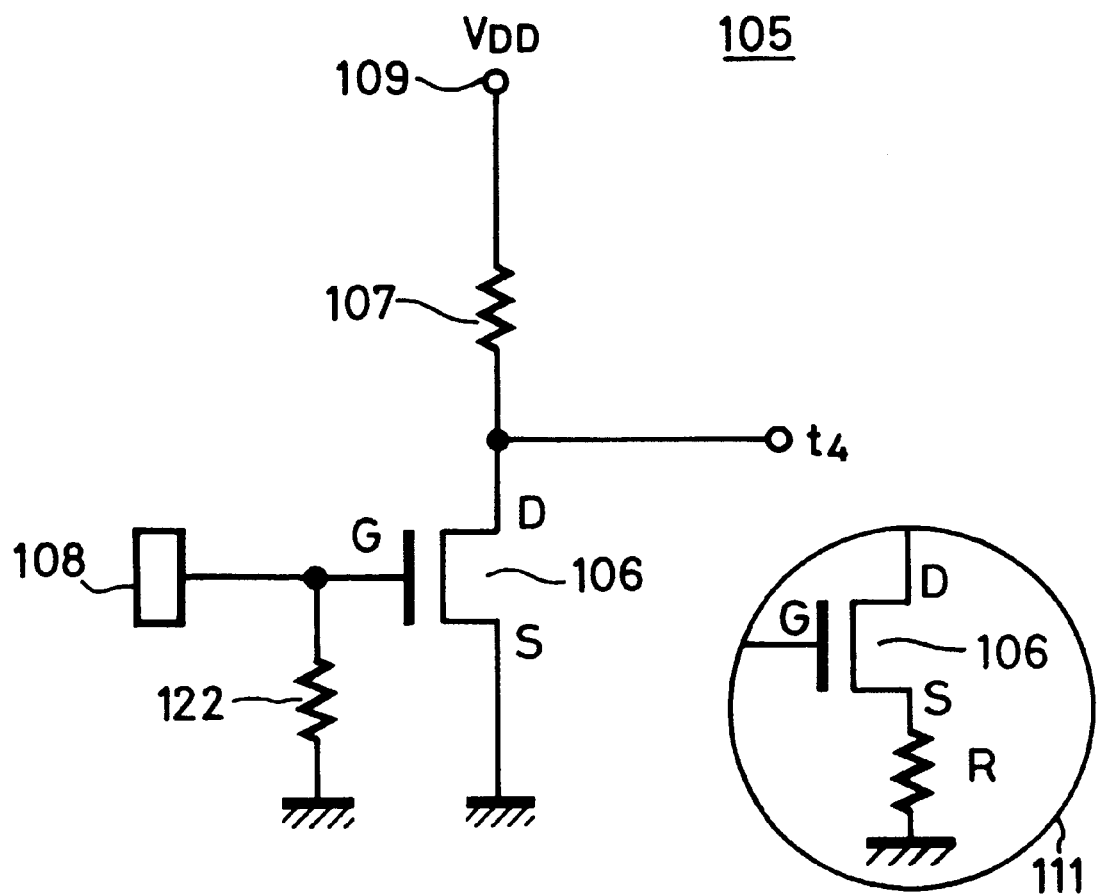
FIG. 17 is a circuit diagram showing an example of an inverter-type bias circuit according to the present invention.

FIG. 17 shows another example of a bias circuit. This bias circuit can adjust a potential in a wide range. In particular, this bias circuit is an amplifying type bias circuit which can obtain a large change of an output with a small potential shift amount.

A bias circuit 105 according to this embodiment is an inverter type bias circuit which includes a drive MIS transistor 106 and a load resistor 107. A drain D of the drive MIS transistor 106 is connected through the load resistor 107 to a power supply terminal 109 to which the power supply voltage $V_{DD}$ is applied. The source S of the drive MIS transistor 106 is grounded. The gate G of the drive MIS transistor 106 is used as an input side and an output terminal $t_4$ is led out from the drain D of the drive MIS transistor 106.

The drive MIS transistor 106 might be formed of the MISFET having the MONOS structure, e.g., the n-channel MISFET 21N shown in FIG. 4. A resistor 122 similar to the resistor $R_1$ is connected between the gate G and the source S of the drive MIS transistor 106.

In this inverter type bias circuit 105, in the initial state, the drive MIS transistor 106 is placed in its on-state. Then, if the drive MIS transistor 106 is driven in the enhancement direction and completely turned off by effectively utilizing the potential shift relative to the drive MIS transistor 106 according to the above-mentioned example, then an output bias from the output terminal $t_4$ is changed in a range from 0V to the power supply voltage V. Therefore, this bias circuit 105 is of the inverter type to obtain a large adjustment range by a small potential shift amount. The bias circuit 105, however, cannot remove the influence exerted when the voltage is fluctuated.

Figure 18:
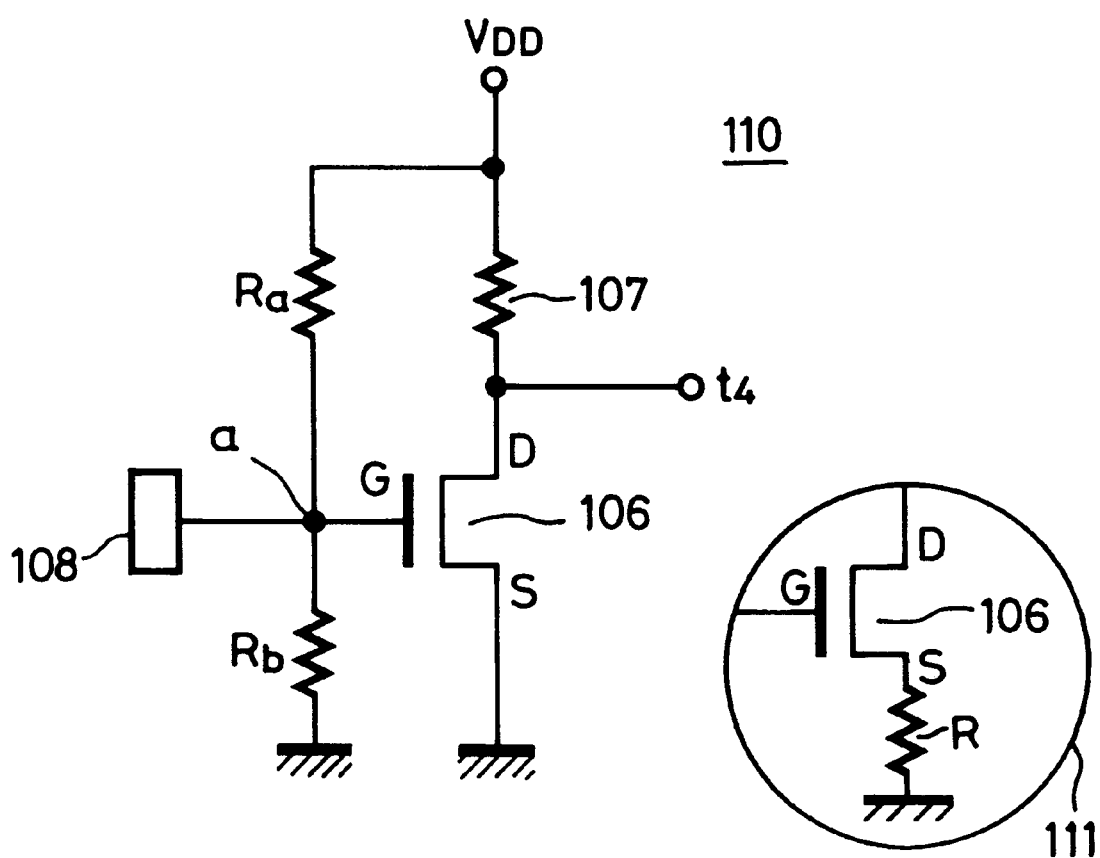
FIG. 18 is a circuit diagram showing another example of an inverter-type bias circuit according to the present invention.

FIG. 18 shows a further example of an inverter type bias circuit which can be protected from being affected by the fluctuation of voltage.

A bias circuit 110 according to this embodiment is of the inverter type, i.e., the bias circuit 110 includes the drive MIS transistor 106 and the load resistor 107. The drain D of the drive MIS transistor 106 is connected through the load resistor 107 to the power supply voltage $V_{DD}$ and the source S thereof is grounded. The gate G of the drive MIS transistor is used as the input side and the output terminal $t_4$ is led out to the side of the drain D. In addition to the above-mentioned circuit arrangement, according to this embodiment, there are provided resistors Ra and Rb which divide the power supply voltage $V_{DD}$. Resultant divided voltages are applied to the gate G of the drive MIS transistor 106. A dividing ratio is made equivalent to a gain of the inverter. The drive MIS transistor 106 might be the MISFET having the MONOS structure, e.g., the n-channel MISFET 21N shown in FIG. 4.

The source of the inverter need not be directly connected to the ground (GND) but may be grounded through a feedback resistor R as shown in an enlarged circle 111 shown in FIGS. 17 and 18. It is desirable that the feedback resistor R is provided in response to a required gain. If the gain is lowered properly, then the potential l can be adjusted more easily. Moreover, the feedback resistor R might be any one of the polycrystalline silicon resistor, the MIS resistor and the diffusion resistor.

The load resistor 107 might be a constant current source similarly to the source-follower type bias circuit. Further, the resistors 122, $R_a$ and $R_b$ might be formed of any one of the polycrystalline silicon resistor, the MIS resistor and the diffusion resistor so long as they can withstand a high voltage.

According to the bias circuit 110, if the power supply voltage $V_{DD}$ is fluctuated, a gate bias (gate bias at a point a in FIG. 18) applied to the gate is fluctuated by a shift amount of (1/gain) of the power supply voltage $V_{DD}$. This fluctuated amount of the gate bias is amplified, inverted by the amount of the gain and then supplied to the output side so that the fluctuated amount of the power supply voltage $V_{DD}$ applied to the drain is absorbed so as to cancel the fluctuated amount out.

In this bias circuit 110, as far as the drive MIS transistor 106 is turned on by the gate bias applied to the gate of the drive MIS transistor 106, the output becomes 0V in the initial stage and the drive MIS transistor 106 is driven in the enhancement state by the injection of electrons. Therefore, the output can be varied up to the power supply voltage $V_{DD}$.

Thus, the bias circuit 110 can obtain a large change of output by a small shift amount and can be protected from being affected by the fluctuation of the power supply voltage $V_{DD}$. Therefore, this bias circuit 110 becomes a best adjusting circuit for setting the substrate voltage $V_{sub}$ of the CCD solid-state imaging device.

Figure 19:
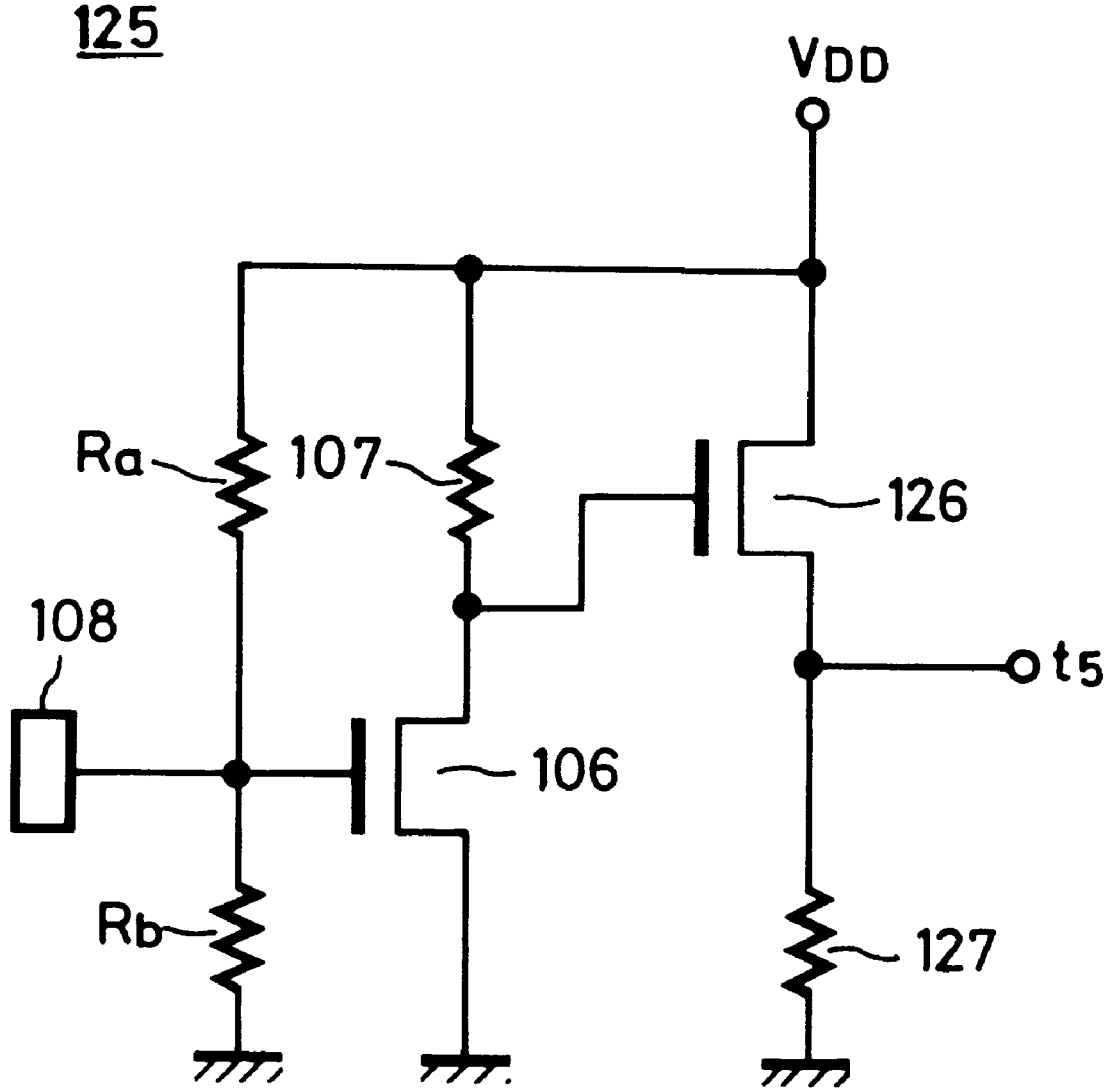
FIG. 19 is a circuit diagram showing a bias circuit according to another embodiment of the present invention.
Figure 20:
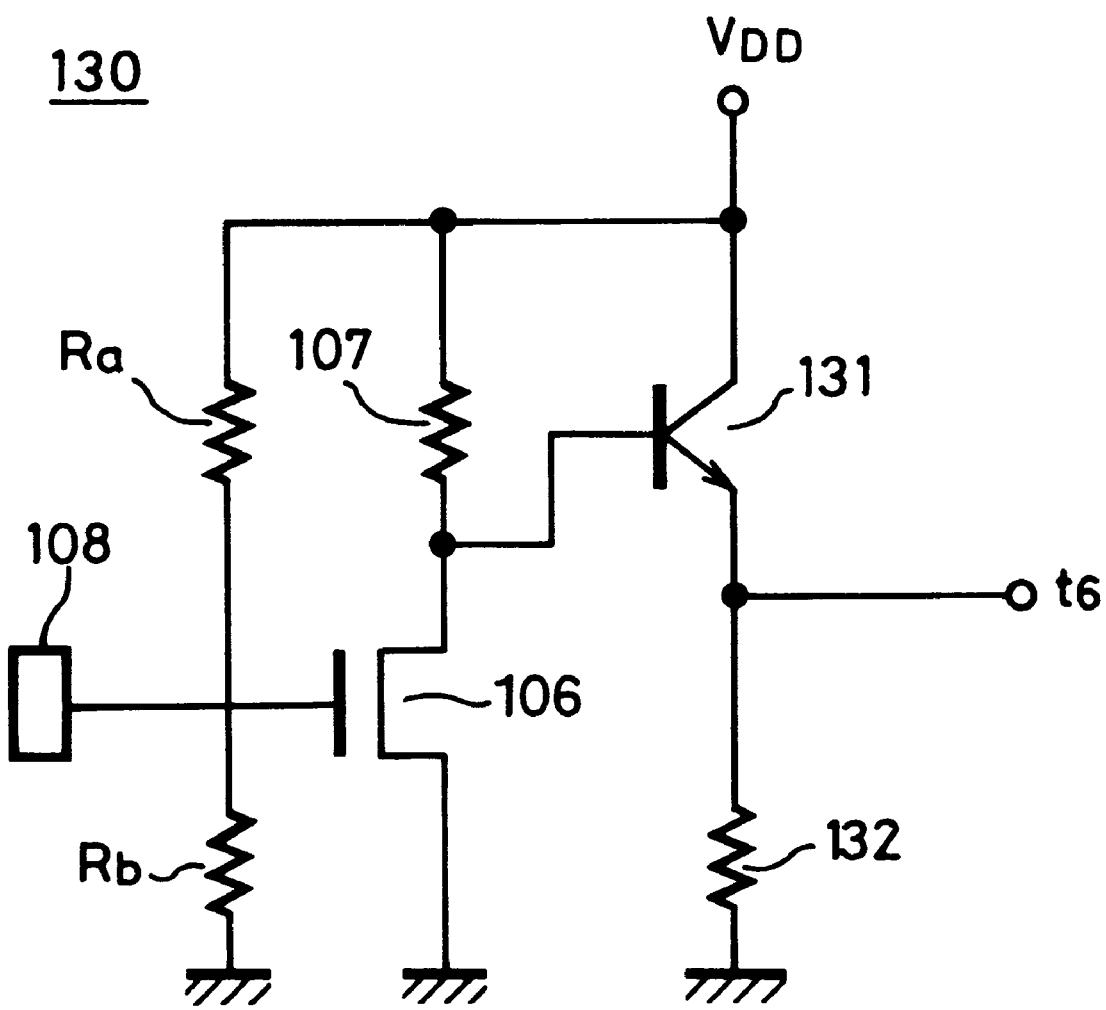
FIG. 20 is a circuit diagram showing a bias circuit according to still another embodiment of the present invention.
Figure 21:
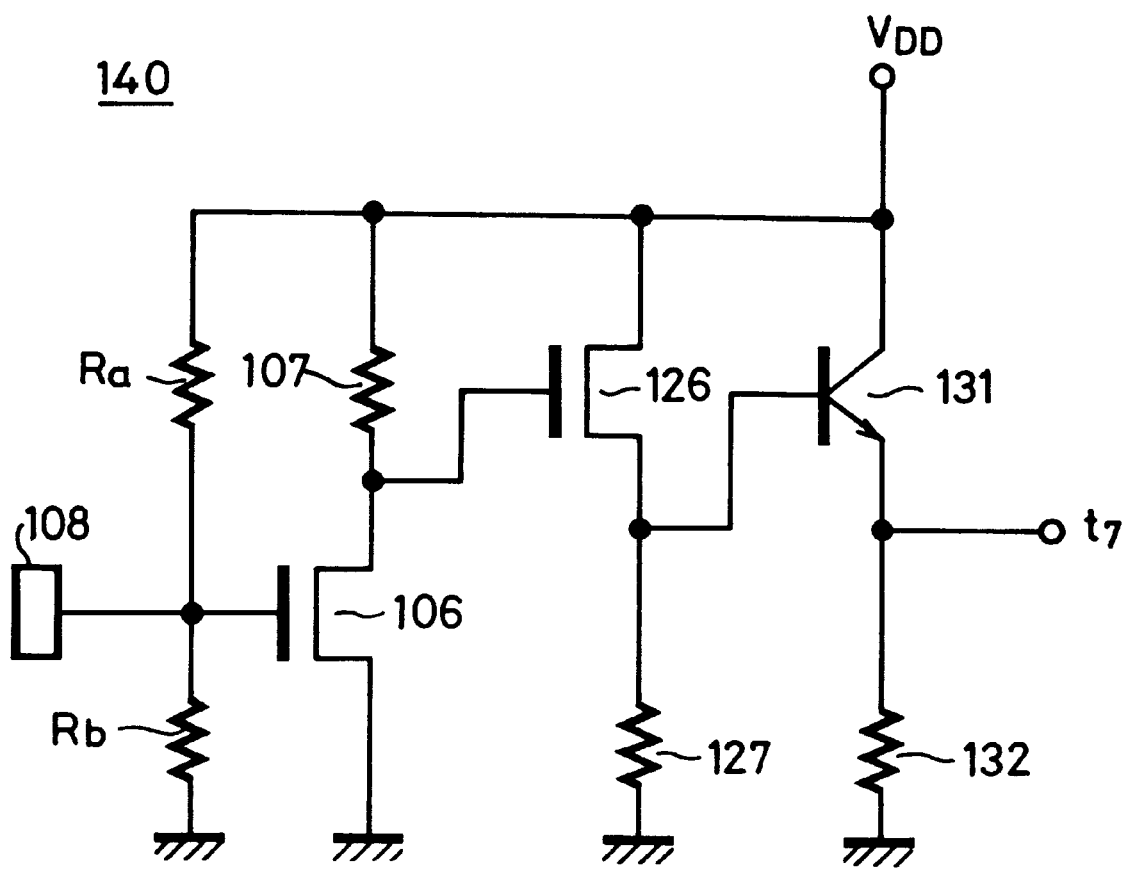
FIG. 21 is a circuit diagram showing a bias circuit according to a further embodiment of the present invention.

FIGS. 19, 20 and 21 show further examples of bias circuits. A bias circuit 125 shown in FIG. 19 differs from the inverter type bias circuit 110 shown in FIG. 18 in that a source-follower circuit composed of a drive MIS transistor 126 and a load resistor 127 is connected to the output of the inverter type bias circuit 110 and that an output terminal $t_5$ is led out from the source of the drive MIS transistor 126 to thereby lower the output impedance.

A bias circuit 130 shown in FIG. 20 differs from the inverter type bias circuit 110 shown in FIG. 18 in that an emitter-follower circuit composed of a drive bipolar transistor 131 and a load resistor 132 is connected to the output of the inverter type bias circuit 110 shown in FIG. 18 and that an output terminal $t_6$ is led out from the emitter of the bipolar transistor 131. According to the bias circuit 130, the output impedance can be lowered and the solid-state imaging device can withstand a higher voltage when a shutter pulse is applied to the solid-state imaging device so as to start an exposure.

A bias circuit 140 shown in FIG. 21 differs from the bias circuit 125 shown in FIG. 19 in that an emitter-follower circuit composed of a drive bipolar transistor 131 and a load resistor 132 is connected to the output of the bias circuit 125 shown in FIG. 19 and that an output terminal $t_7$ is led out from the emitter of the drive bipolar transistor 131. According to this bias circuit 140, since the emitter-follower circuit is additionally connected to the final output stage, the output impedance can be lowered and the solid-state imaging device can withstand a higher voltage when a shutter pulse is applied to the solid-state imaging device so as to start an exposure.

Specific processes for shifting a potential of the MIS element will be described below. In this case, how to shift the potential in the n-channel MIS device, for example, will be described.

As earlier noted in FIG. 5, the electrons e are filled on the channel surface by holding both or either of the source region 23 and the drain region 24 at 0V to thereby hold the channel potential at 0V. In this state, if the (+) positive high voltage $V_G$ is applied to the gate electrode 30, then a strong electric field is applied to the gate insulating film 25 and the electrons e on the silicon surface are moved through the barrier of the silicon oxide film 26 and entered into the silicon nitride film 27. A total amount of electrons e entered into the silicon nitride film 27 is determined on the basis of the electric field applied to the silicon oxide film 26 and a time during which the electric field is applied to the silicon oxide film 26. An amount of voltage applied to the gate insulating film 25 should be selected in proportion to a film thickness $d_1$ of the gate insulating film 25.

Accordingly, the voltage applied to the gate insulating film 25 or the time during which the voltage is applied to the gate insulating film 25 are controlled in order to obtain a desired potential.

Since the potential value is nearly equal to the output voltage of the source-follower (or the inverter) circuit, an output value is read out by applying a pulse voltage to the gate and then judged. This operation is repeated.

Figure 22:
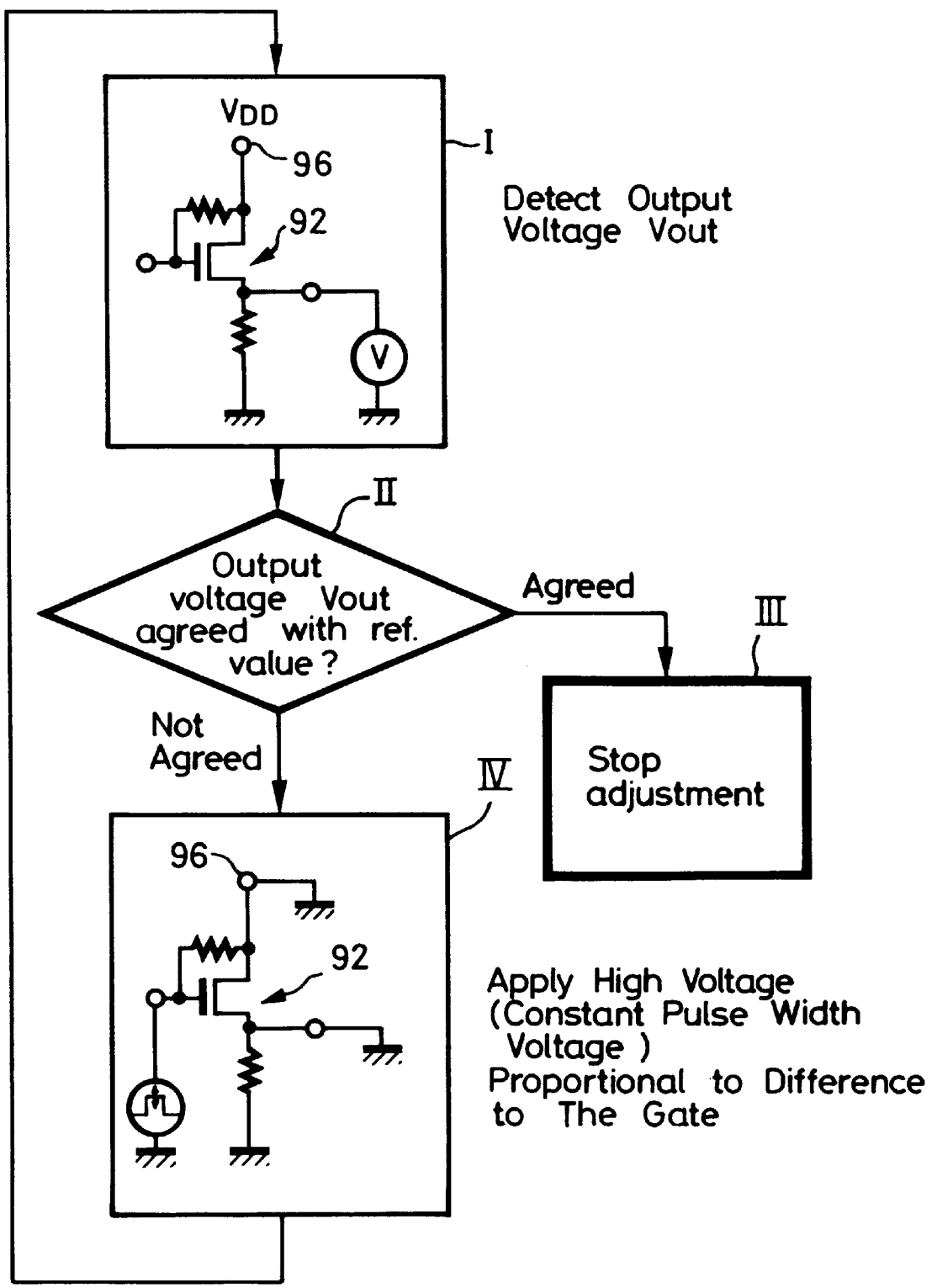
FIG. 22 is a flowchart to which reference will be made in explaining an operation of a potential adjustment system using a pulse amplitude modulation according to the present invention.

As a system for adjusting a potential of a MIS device having a MONOS structure, there are known two systems using a pulse amplitude modulation and a pulse width modulation. FIG. 22 is a flowchart, partly in circuit form, showing an example of a potential adjustment system using a pulse amplitude modulation. Similarly to FIGS. 11A and 11B, the MIS element having the MONOS structure is used as the drive MIS transistor 92 and the drive MIS transistor 92 and the load resistor 93 constitute the source-follower circuit.

Referring to FIG. 22, an output voltage $V_{out}$ of the source-follower circuit is detected in the first step I. Then, the processing proceeds to the next comparison step II, whereat the detected output voltage $V_{out}$ is compared with a reference value (desired voltage value). If the output voltage $V_{out}$ is agreed with the reference value (i.e., $V_{out} \leq$ reference value), then it is determined that the potential of the MIS device is properly set to the desired potential. Then, the processing proceeds to step III, whereat a potential adjustment is stopped.

If on the other hand it is determined in the comparison step II that the detected output voltage $V_{out}$ is not agreed with the reference value (i.e., $V_{out}>$reference value), then the processing proceeds to the next step IV, whereat the power supply terminal 96 of the drain side is held at 0V and a high voltage (i.e., pulse voltage whose amplitude is modulated by a constant pulse width) $\phi_{VG}$ proportional to the difference between the reference value and the detected output voltage $V_{out}$ is applied to the gate of the drive MIS transistor 92 to thereby inject electrons of a desired amount into the gate insulating film.

Then, the processing returns to the step I, whereat the output voltage $V_{out}$ of the source-follower circuit is detected. The processing then proceeds to the next comparison step II, whereat the detected output voltage $V_{out}$ is compared with the reference value. Steps I and II are repeated until the output voltage $V_{out}$ is agreed with the reference value.

Figure 23:
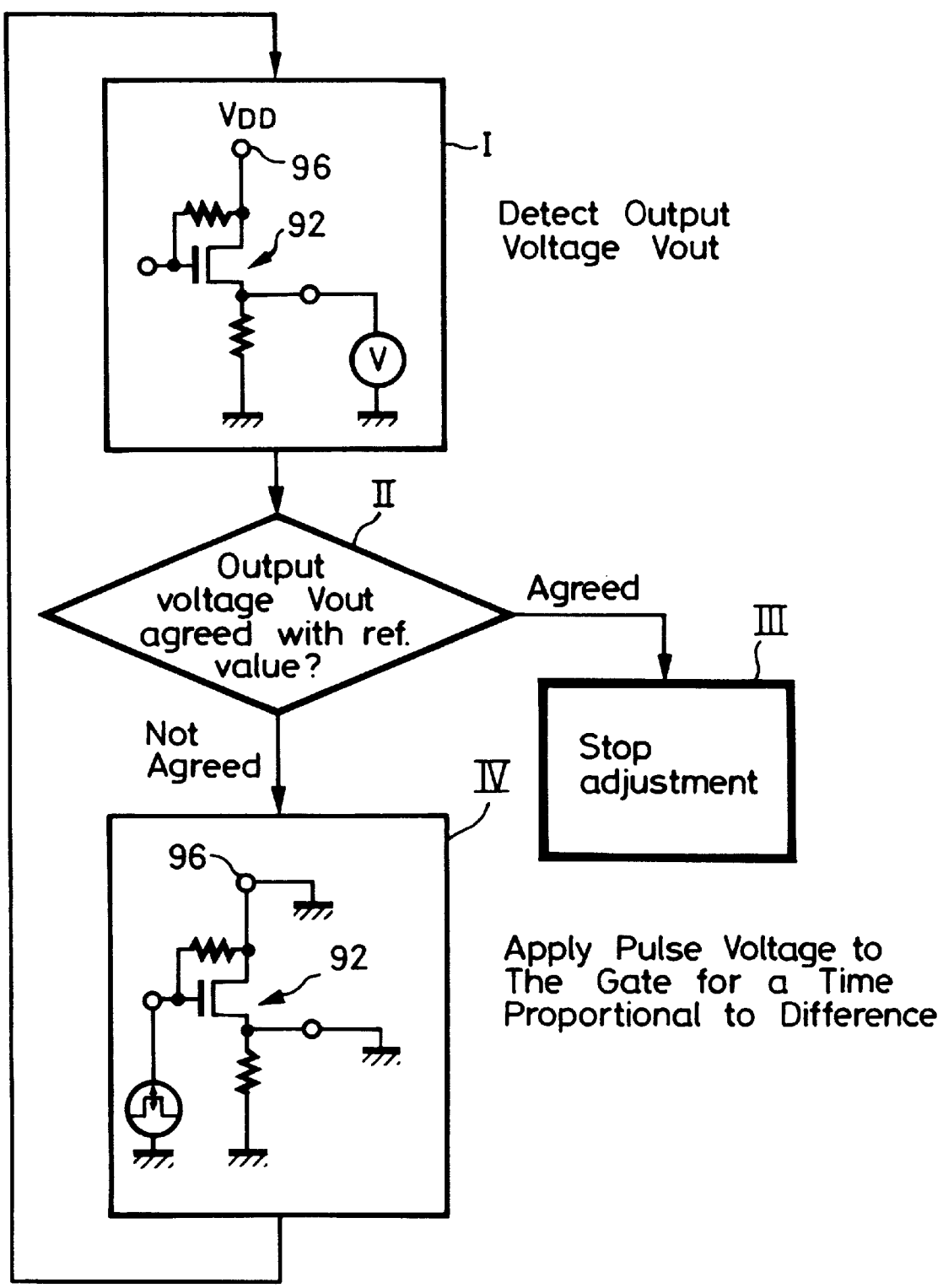
FIG. 23 is a flowchart to which reference will be made in explaining an operation of a potential adjustment system using a pulse width modulation system according to the present invention.

FIG. 23 is a flowchart, partly in circuit form, showing a potential adjustment operation according to the pulse width modulation system.

Similarly to FIG. 22, the drive MIS transistor 92 is composed of the MIS device having the MONOS structure and the drive MIS transistor 92 and the load resistor 93 constitute the source-follower circuit.

Referring to FIG. 23, the output voltage $V_{out}$ of the source-follower circuit is detected in the first step I.

Then, the processing proceeds to the next comparison step II, whereat the detected output voltage $V_{out}$ is compared with the reference value (desired voltage value). If the detected output voltage $V_{out}$ is agreed with the reference value (i.e., $V_{out} \leq$ reference value), then it is determined that the potential of the MIS transistor 92 is properly set to a desired potential. Then, the processing proceeds to step III, whereat the potential adjustment is stopped.

If on the other hand it is determined in the comparison step II that the detected output voltage $V_{out}$ is not agreed with the reference value (i.e., $V_{out}>$reference value), then the processing proceeds to the next step IV, whereat the power supply terminal 96 of the drain side is held at 0V and the pulse voltage $\phi_{VG}$ is applied to the gate for a time proportional to the difference between the reference value and the output voltage $V_{out}$, i.e., pulse voltage $\phi_{VG}$ whose pulse width is adjusted by a constant voltage (amplitude) is applied to the gate to thereby inject electrons of a predetermined amount into the gate insulating film.

Then, the processing returns to step I, whereat the output voltage $V_{out}$ of the source-follower circuit is detected. Then, the processing proceeds to the comparison step II, whereat the detected output voltage $V_{out}$ is compared with the reference value. Steps I and II are repeated until the detected output voltage $V_{out}$ is agreed with the reference value.

In this way, the potential of the MIS device having the MONOS structure can be set to a desired value.

When the inverter circuit is used, it is possible to set a potential to a desired potential by repeating the similar processes after an output voltage of the inverter circuit has been detected.

While the bias circuit according to the present invention is applied to the CCD solid-state imaging device of the interline transfer system as described above, it is needless to say that the present invention is not limited thereto and can be applied to a CCD solid-state imaging device of a frame-interline transfer system.

While the bias circuit according to the present invention is used to set the substrate voltage of the CCD solid-state imaging device and the reset gate bias as described above, the present invention is not limited thereto and the above bias circuit can set a control voltage applied to the substrate of other amplifying-type solid-state imaging device.

The amplifying-type solid-state imaging device accumulates photoelectrically-converted holes (signal charges) in a p-type potential well of an n-channel MOS transistor and outputs the change of a channel current based on a potential fluctuation (i.e., potential shift in the so-called back-gate) in the p-type potential well.

Figure 24:
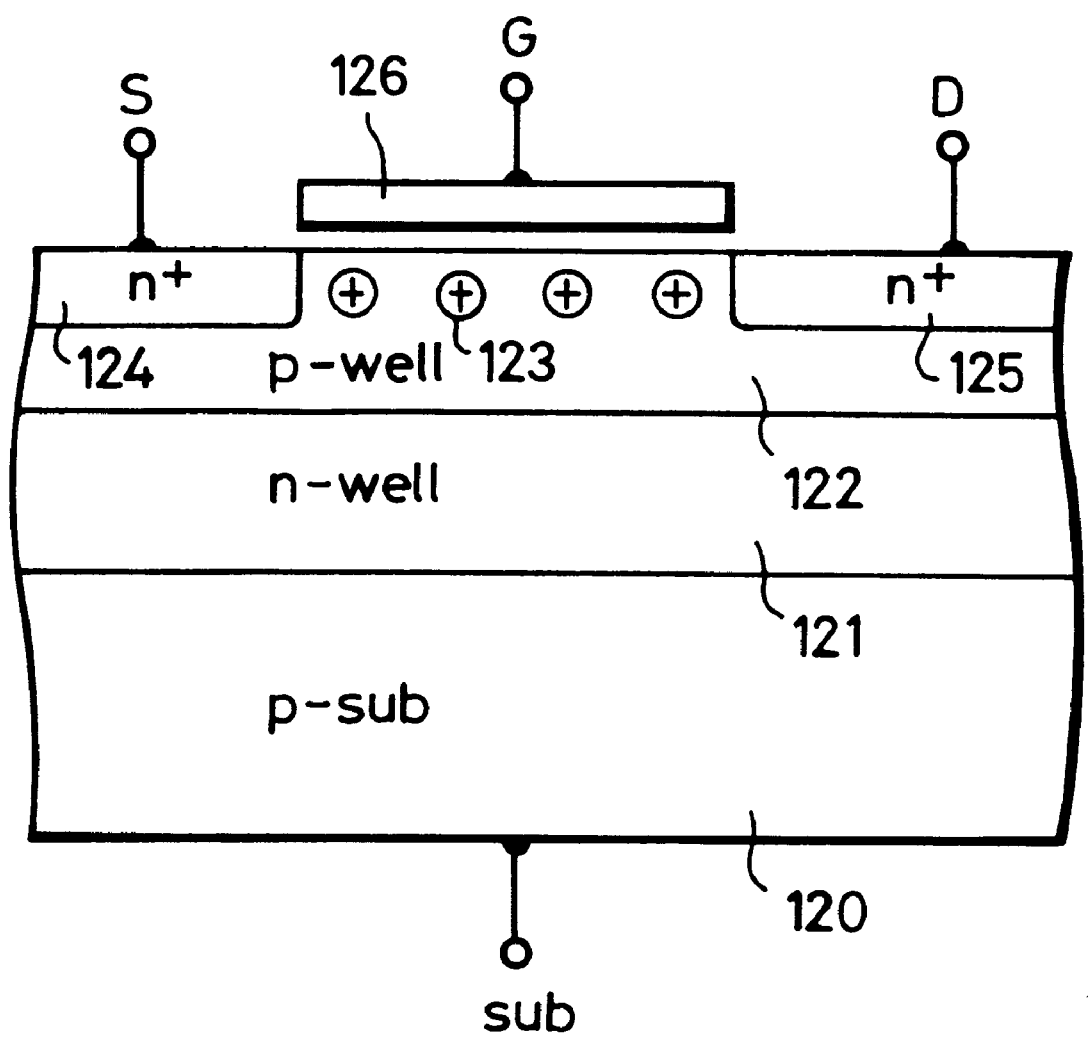
FIG. 24 is a cross-sectional view showing an example of a pixel metal oxide semiconductor (MOS) transistor in an amplifying type solid-state imaging device according to the present invention.

FIG. 24 is a schematic cross-sectional view showing a semiconductor structure of a unit pixel in an amplifying-type solid-state imaging device. In FIG. 24, reference numeral 120 denotes a p-type substrate, 121 an n-type well region and 122 a p-type well region in which there are accumulated photoelectrically-converted holes (signal charges) 123. An n-type source region 124 and an n-type drain region 125 are formed on the p-type well region 122. A gate electrode 126 is formed between the two regions 124 and 125 through a gate insulating film (not shown). A plurality of the above unit pixels are arranged in a matrix fashion. Then, though not shown, gates of the unit pixels are connected to a vertical scanning line of a vertical scanning circuit and sources are connected to a signal line. One end portion of a signal line is connected to a load MOS transistor, and the other end of the signal line is connected to a horizontal signal line through a sample and hold circuit for sampling and holding a pixel signal and a switching MOS transistor. A gate of each switching MOS transistor is connected to a horizontal scanning circuit. A drain of each unit pixel is connected to a power supply and a switching MOS transistor for resetting is connected to the power supply and the signal line, though not shown.

Holes 123 accumulated in the p-type well region 122 of the unit pixel control the channel region used when a signal is read out, whereby a potential at the source terminal in the source-follower circuit composed of the unit pixel and the load MOS transistor is changed. This change of potential is output through the sample and hold circuit to the horizontal signal line as the pixel signal.

FIG. 25 is a potential diagram. In this amplifying-type solid-state imaging device, when the pixel is scanned, a substrate voltage $V_{sub}$ (e.g., 0V) is applied to a substrate terminal Sub as shown by a solid line in FIG. 25. When the amplifying-type solid-state imaging device is reset so as to start an exposure (or when an exposure is started based on an operation of an electronic shutter), as shown by a dotted line in FIG. 25, the same gate voltage as that used when the pixel is scanned is applied to the gate and a desired substrate voltage $V_{sub}R$ (e.g., about −6V to −10V) is applied to the substrate terminal Sub. The holes (signal charges) 123 are discharged to the substrate 120. The aforesaid bias circuits 91, 102, 105 or 110 can be used to set the substrate voltage $V_{sub}R$ used when the amplifying-type solid-state imaging device is reset (or when the electronic shutter is energized).

The present invention can be applied to a method of correcting fluctuated threshold values among MIS devices in a semiconductor integrated circuit composed of a plurality of MIS devices. In this example, each MIS device has a so-called MONOS structure having a gate insulating film of a three-layer structure wherein a silicon oxide film, a silicon nitride film and a silicon oxide film are laminated, in that order. A channel potential of each MIS device is detected and the detected channel potential is compared with a reference value. Then, the source and the drain are held at 0V and the high voltage is applied to the gate, whereby electric charges of an amount large enough to correct a difference between the channel potential and the reference value are injected into and accumulated in the silicon nitride film of the gate insulating film by the similar charge injection method. Thus, it is possible to correct fluctuations of the threshold voltages of the MIS devices.

The present invention can be applied to a method of adjusting a channel potential of MIS device. Also in this example, the MIS device has the MONOS structure having the gate insulating film of three-layer structure in which the silicon oxide film, the silicon nitride film and the silicon oxide film are laminated, in that order. The channel potential of the MIS device is compared with the reference value and electric charges of an amount large enough to correct the difference between the compared channel potential and the reference value are injected into the silicon nitride film of the gate insulating film of the MIS device by the similar method. Thus, the channel potential of the MIS device can be adjusted.

Other embodiment of the present invention can be applied to CCD charge transfer devices applied to a solid-state imaging device or the like. The charge transfer device according to this embodiment includes a charge transfer portion in which a plurality of transfer electrodes are arranged on a semiconductor substrate through a gate insulating film in the transfer direction, a floating capacitor for accumulating electric charges transferred thereto from the charge transfer portion, i.e., a so-called floating diffusion region formed of a first conductivity type semiconductor region, and a reset transistor for resetting a potential of the floating capacitor to a predetermined potential. The reset transistor is composed of a so-called reset drain region formed of a first conductivity type semiconductor region applied with a predetermined potential, a floating capacitor and a reset gate portion having a MIS structure formed between the reset drain region and the floating capacitor. A bias voltage supplied to the reset transistor, i.e., the gate electrode (control electrode) of the reset gate portion can be obtained by the aforesaid bias circuit 91, 102, 105 or 110.

The inventive MIS device generally refer to a CCD structure, a CCD transfer register, a MISFET or the like.

A gate insulating film of the CCD transfer register, for example, can be formed as a three-layer structure composed of a silicon oxide film, a silicon nitride film and a silicon oxide film and a channel potential under the transfer portion can be set by accumulating electric charges in the silicon nitride film.

As described above, according to the embodiments of the present invention, the value of the potential or gate bias in the MIS device can be finely set in an analogue fashion. Accordingly, in the case of the CCD solid-state imaging device, for example, in particular, the reset gate portion and the substrate voltage need not be adjusted and the amplitude of the reset pulse can be lowered, thereby reducing a power consumption.

If the bias circuit is used, there are brought various advantages from a protecting device standpoint such that a part of protecting device can be moved.

Furthermore, the source-follower type bias circuit is suitable for the bias circuit for obtaining the DC bias $V_{RG}$ of the reset gate portion of the CCD solid-state imaging device. The inverter type bias circuit is suitable for the bias circuit for obtaining the substrate voltage of the solid-state imaging device.

According to the inventive analogue MISFET, a threshold value can be set finely in an analogue fashion. Therefore, the inventive analogue MISFET is for use with an analogue circuit or the like.

According to the inventive MIS device, a threshold value or a channel potential can be set finely in an analogue fashion. Therefore, the inventive MIS device is for use with a MISFET and a CCD structure (including a solid-state imaging device or the like) or the like. When the inventive MIS device is applied to a CCD solid-state imaging device, for example, a potential under the reset gate portion need not be adjusted from the outside.

According to the inventive method of correcting a threshold voltage, it is possible to correct fluctuations of threshold voltages obtained among MIS devices by injecting electric charges of an amount corresponding to a difference between the fluctuations of the threshold voltages into the gate insulating film.

Then, the gate insulating film is of the three-layer structure of an oxide film, a nitride film and an oxide film. When a threshold voltage is corrected, a channel potential of the MIS device is detected and the detected channel potential is compared with a reference value, whereafter a fluctuation of a threshold voltage between the MIS devices can be easily corrected with a high accuracy by injecting electric charges corresponding to the difference into the nitride film of the gate insulating film.

According to an inventive method of adjusting a channel potential of a MIS device, a channel potential of a MIS device is compared with a reference value and the channel potential can be finely adjusted in an analogue fashion by injecting electric charges of amount suitable for correcting a difference between the channel potential and the reference value.

A bias circuit according to the present invention has a circuit arrangement in which a load resistor and a MISFET are connected in series between first and second potentials. Since the MISFET is composed of a MISFET whose threshold voltage is controlled by electric charges injected into the gate insulating film, an output bias can be set finely in an analogue fashion.

According to an inventive bias circuit, since a MISFET is operated in the enhancement mode after its channel potential has been adjusted by injecting electric charges into a gate insulating film of the MISFET, this bias circuit serves as a low-clamping circuit having a diode characteristic when a load current is reduced. Therefore, when a bias voltage of this bias circuit is set to a DC bias $V_{RG}$ of the reset gate, even if an amplitude of a reset pulse and a duty ratio are fluctuated, a low-level voltage of the reset gate can be held constant and a saturated signal can be prevented from becoming insufficient.

According to an inventive charge transfer device, since a bias voltage supplied to a control electrode of a reset transistor which resets a potential of a floating capacitor is generated by the above bias circuit, a desired bias voltage can be supplied to the control electrode of the reset transistor and the reset transistor can carry out a proper reset operation.

Further, according to an inventive solid-state imaging device, since a control voltage supplied to a means for discharging a pixel signal is generated by the aforesaid bias circuit, a desired control voltage can be supplied to the pixel signal discharging means and the pixel signal discharging means can discharge a pixel signal satisfactorily. For example, a DC bias voltage applied to the reset gate portion and the substrate voltage need not be adjusted from the outside. Moreover, since the amplitude of the reset pulse is lowered, it becomes possible to reduce a power consumption. The setting of a substrate voltage in an amplifying-type solid-state imaging device need not be adjusted. In addition, since the aforesaid bias circuit is fabricated into a chip of a solid-state imaging device, a part of protecting devices can be reduced.

Furthermore, according to an inventive charge detecting device, it is possible to set a potential under the gate to a proper value by injecting electric charges into a gate insulating film of a reset MISFET which resets a potential of a floating capacitor in which signal charges are accumulated, in particular, a gate insulating film having a multi-layer structure composed of an oxide film, a nitride film and an oxide film.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A charge transfer device comprising:
   a charge transfer portion;
   a floating capacitor for accumulating electric charges transferred by said charge transfer portion;
   a reset transistor for setting a potential of said floating capacitor to a predetermined potential; and
   a bias circuit for generating a bias voltage supplied to a control electrode of said reset transistor, wherein said bias circuit includes a load and a MIS field effect transistor connected in series between first and second potentials and said MIS field effect transistor has a gate insulating film into which electric charges for adjusting a channel potential are injected.

2. A solid-state imaging device comprising:
   a plurality of pixels;
   means for outputting signals obtained from said pixels;
   means for discharging unnecessary signals of said pixels; and
   a bias circuit for generating a control voltage to control a discharge operation of said discharge means, wherein said bias circuit includes a load resistor and a MIS field effect transistor connected in series between first and second potentials and said MIS field effect transistor has a gate insulating film into which electric charges for adjusting a channel potential are injected.

3. A solid-state imaging device according to claim 2, wherein said pixel has a signal charge accumulation portion formed of a first conductivity type semiconductor region and said unnecessary signal discharge means includes a gate portion formed of a second conductivity type semiconductor region adjacent to said signal charge accumulation portion and a drain portion formed of a first conductivity type semiconductor region adjacent to said gate portion.

4. A solid-state imaging device according to claim 3, wherein said control voltage is supplied to said drain portion.

5. A solid-state imaging device having a charge detecting device, the solid-state imaging device comprising:
- a floating capacitor for accumulating signal charges;
- a detecting circuit for detecting signal charges accumulated in said floating capacitor; and
- a MIS field effect transistor for resetting a potential of said floating capacitor to a predetermined potential, said MIS field effect transistor having a gate insulating film into which electric charges of a predetermined amount are injected wherein said predetermined amount of electric charges is based on a voltage applied to a gate electrode.

6. The solid state imaging device according to claim 5, wherein said gate insulating film has a multi-layer structure in which an oxide film, a nitride film and an oxide film are laminated, in that order.

* * * * *